United States Patent
Nakajima

(10) Patent No.: US 9,583,506 B2
(45) Date of Patent: Feb. 28, 2017

(54) SEMICONDUCTOR MEMORY DEVICE AND METHOD OF MANUFACTURING THE SAME

(71) Applicant: KABUSHIKI KAISHA TOSHIBA, Minato-ku (JP)

(72) Inventor: Kazuaki Nakajima, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/850,467

(22) Filed: Sep. 10, 2015

(65) Prior Publication Data

US 2016/0322380 A1    Nov. 3, 2016

Related U.S. Application Data

(60) Provisional application No. 62/153,916, filed on Apr. 28, 2015.

(51) Int. Cl.
*H01L 27/115* (2006.01)

(52) U.S. Cl.
CPC .. *H01L 27/11582* (2013.01); *H01L 27/11519* (2013.01); *H01L 27/11556* (2013.01); *H01L 27/11565* (2013.01)

(58) Field of Classification Search
CPC ......... H01L 27/11582; H01L 27/11519; H01L 27/11556; H01L 27/11565
See application file for complete search history.

(56) References Cited

U.S. PATENT DOCUMENTS

| | | |
|---|---|---|
| 8,115,245 B2 | 2/2012 | Yoshimizu et al. |
| 2012/0064682 A1 | 3/2012 | Jang et al. |
| 2012/0104484 A1 | 5/2012 | Lee et al. |

*Primary Examiner* — Thanh V Pham
(74) *Attorney, Agent, or Firm* — Oblon, McClelland, Maier & Neustadt, L.L.P.

(57) ABSTRACT

According to an embodiment, a semiconductor memory device comprises a stacked body, a semiconductor layer, a charge accumulation layer, and a first layer. The stacked body includes a plurality of control gate electrodes stacked above a substrate. The semiconductor layer has one end connected to the substrate and faces the plurality of control gate electrodes. The charge accumulation layer is positioned between the control gate electrode and the semiconductor layer. The first layer is surrounded by the stacked body in a plane parallel to the substrate. Moreover, a width in a first direction parallel to the substrate, of the first layer is larger than a width in the first direction of the semiconductor layer.

12 Claims, 22 Drawing Sheets

SEMICONDUCTOR MEMORY DEVICE AND METHOD OF MANUFACTURING THE SAME

CROSS-REFERENCE TO RELATED APPLICATIONS

This application is based upon and claims the benefit of U.S. Provisional Patent Application No. 62/153,916, filed on Apr. 28, 2015, the entire contents of which are incorporated herein by reference.

FIELD

Embodiments described herein relate to a semiconductor memory device and a method of manufacturing the same.

BACKGROUND

Description of the Related Art

A flash memory that stores data by accumulating a charge in a charge accumulation layer, is known. Such a flash memory is connected by a variety of systems such as NAND type or NOR type, and configures a semiconductor memory device. In recent years, increasing of capacity and raising of integration level of such a nonvolatile semiconductor memory device have been proceeding. Moreover, a semiconductor memory device in which memory cells are disposed three-dimensionally (three-dimensional type semiconductor memory device) has been proposed to raise the integration level of the memory.

DETAILED DESCRIPTION

A semiconductor memory device according to an embodiment comprises a stacked body, a semiconductor layer, a charge accumulation layer, and a first layer. The stacked body includes a plurality of control gate electrodes stacked above a substrate. The semiconductor layer has one end connected to the substrate and faces the plurality of control gate electrodes. The charge accumulation layer is positioned between the control gate electrode and the semiconductor layer. The first layer is surrounded by the stacked body in a plane parallel to the substrate. Moreover, a width in a first direction parallel to the substrate, of the first layer is larger than a width in the first direction of the semiconductor layer.

Next, nonvolatile semiconductor memory devices according to embodiments will be described in detail with reference to the drawings. Note that these embodiments are merely examples, and are not shown with the intention of limiting the present invention. Moreover, each of the drawings of the nonvolatile semiconductor memory devices employed in the embodiments below is schematic, and thicknesses, widths, ratios, and so on, of layers are different from those of the actual nonvolatile semiconductor memory devices.

The embodiments below relate to nonvolatile semiconductor memory devices having a structure in which a plurality of MONOS (Metal-Oxide-Nitride-Oxide-Semiconductor) type memory cells (transistors) are provided in a height direction, each of the MONOS type memory cells including: a semiconductor layer acting as a channel provided in a column shape perpendicularly to a substrate; and a gate electrode layer provided on a side surface of the semiconductor layer via a charge accumulation layer. However, this is also not intended to limit the present invention, and the present invention may be applied also to a memory cell of another form of charge accumulation layer, for example, a SONOS (Semiconductor-Oxide-Nitride-Oxide-Semiconductor) type memory cell, or a floating gate type memory cell, and so on.

[First Embodiment]

[Semiconductor Memory Device]

Figure 1:
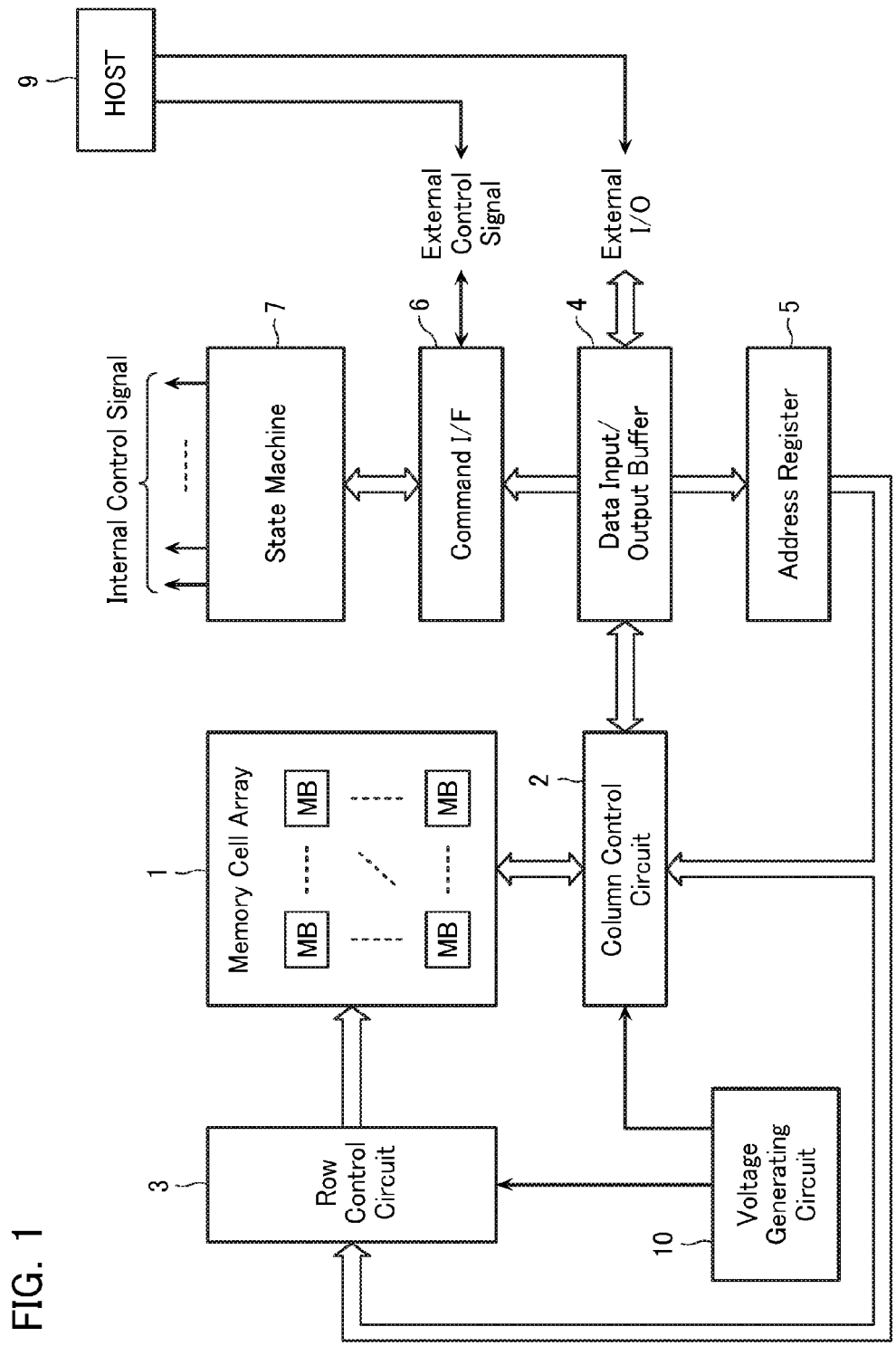
FIG. 1 is a block diagram of a nonvolatile semiconductor memory device according to a first embodiment.

FIG. 1 is a block diagram of a nonvolatile semiconductor memory device according to a first embodiment. The same nonvolatile semiconductor memory device stores write data inputted from an external host 9, in a certain address in a memory cell array 1. In addition, the same nonvolatile semiconductor memory device reads data from a certain address in the memory cell array 1, and outputs the data to the external host 9.

That is, as shown in FIG. 1, the same nonvolatile semiconductor memory device comprises the memory cell array 1 that stores data. The memory cell array 1 comprises a plurality of memory blocks MB. As will be described later with reference to FIG. 2, these memory blocks MB each comprise: a plurality of memory cells MC; and a bit line BL and a word line WL connected to these memory cells MC.

As shown in FIG. 1, the same nonvolatile semiconductor memory device comprises a column control circuit 2 provided in a periphery of the memory cell array 1. The column control circuit 2 transfers a voltage generated by a voltage generating circuit 10 to a desired bit line BL according to inputted data. Moreover, the column control circuit 2 comprises an unillustrated sense amplifier, and detects a voltage or potential of a certain bit line BL.

As shown in FIG. 1, the same nonvolatile semiconductor memory device comprises a row control circuit 3 provided in a periphery of the memory cell array 1. The row control circuit 3 transfers a voltage generated by the voltage generating circuit 10 to a desired word line WL, and so on, according to inputted address data.

As shown in FIG. 1, the same nonvolatile semiconductor memory device comprises an address register 5 that supplies address data to the column control circuit 2 and the row control circuit 3. The address register 5 stores address data inputted from a data input/output buffer 4.

As shown in FIG. 1, the same nonvolatile semiconductor memory device comprises the voltage generating circuit 10 that supplies a voltage to the memory cell array 1 via the column control circuit 2 and the row control circuit 3. The voltage generating circuit 10 generates and outputs a voltage of a certain magnitude at a certain timing, based on an internal control signal inputted from a state machine 7.

As shown in FIG. 1, the same nonvolatile semiconductor memory device comprises the state machine 7 that inputs the internal control signal to the voltage generating circuit 10, and so on. The state machine 7 receives command data from the host 9, via a command interface 6, and performs management of read, write, erase, input/output of data, and so on.

As shown in FIG. 1, the same nonvolatile semiconductor memory device comprises the data input/output buffer 4 which is connected to the external host 9 via an I/O line. The data input/output buffer 4 receives write data from the external host 9, and transfers the write data to the column control circuit 2. Moreover, the data input/output buffer 4 receives command data from the external host 9, and transfers the command data to the command interface 6. In addition, the data input/output buffer 4 receives address data from the external host 9, and transfers the address data to the address register 5. Furthermore, the data input/output buffer 4 receives read data from the column control circuit 2, and transfers the read data to the external host 9.

As shown in FIG. 1, the same nonvolatile semiconductor memory device comprises the command interface 6 that receives an external control signal from the external host 9. The command interface 6 determines which of write data, command data, and address data inputted to the data input/output buffer 4 is, based on the external control signal inputted from the external host 9, and controls the data input/output buffer 4. In addition, the command interface 6 transfers to the state machine 7 command data received from the data input/output buffer 4.

Note that the column control circuit 2, the row control circuit 3, the state machine 7, the voltage generating circuit 10, and so on, configure a control circuit that controls the memory cell array 1.

Figure 2:
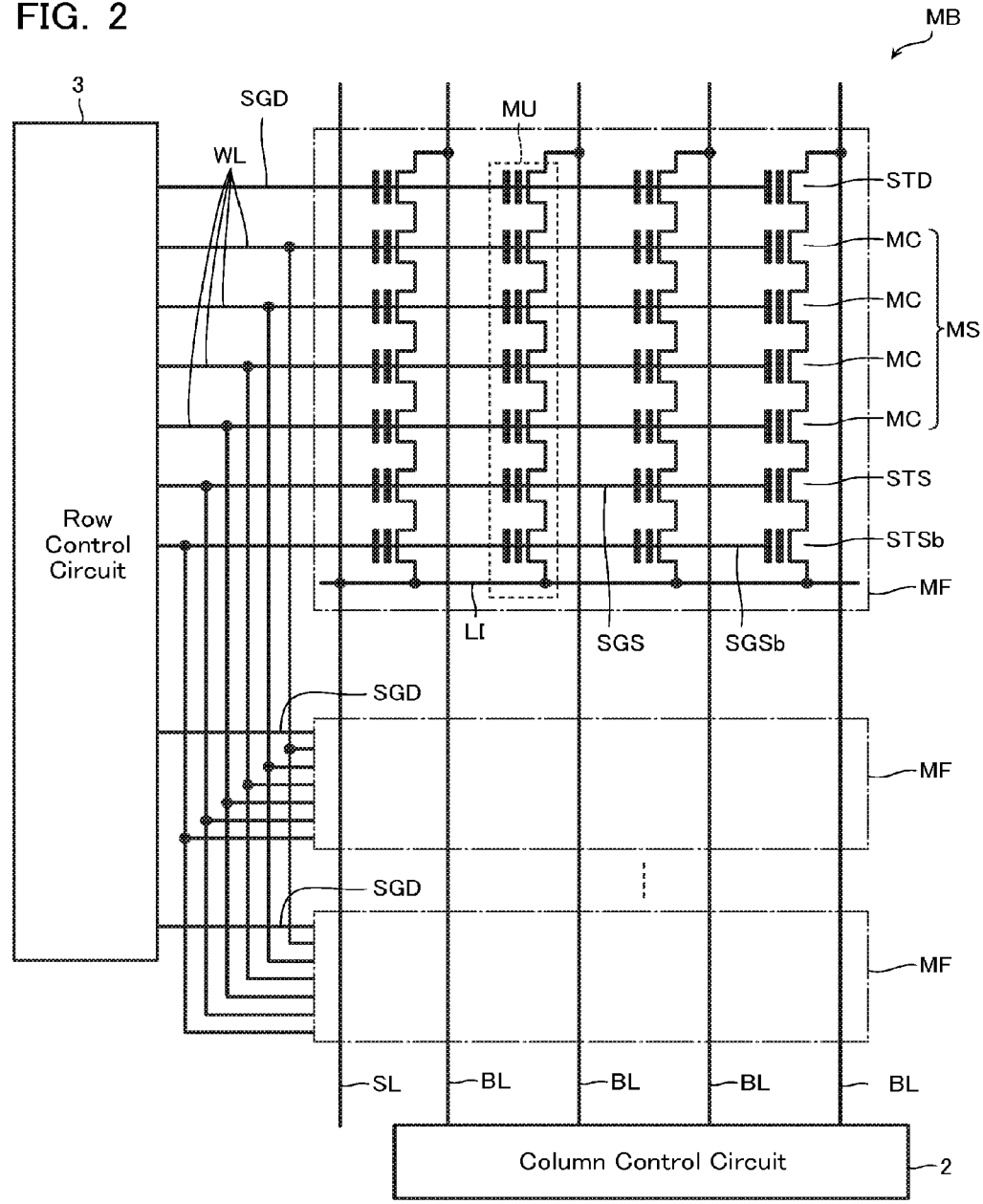
FIG. 2 is a circuit diagram showing a configuration of part of the same nonvolatile semiconductor memory device.

Next, a circuit configuration of part of the memory cell array 1 according to the present embodiment will be described with reference to FIG. 2. FIG. 2 is an equivalent circuit diagram showing a configuration of the memory block MB configuring the memory cell array 1. In the memory block MB shown in FIG. 2, a certain drain side select gate line SGD and a certain word line WL are selected by the row control circuit 3, whereby a certain number of memory cells MC are selected. Moreover, data of the memory cells MC connected to a certain number of bit lines BL is read by the column control circuit 2.

As shown in FIG. 2, the memory blocks MB each comprise a plurality of memory fingers MF. Commonly connected to these plurality of memory fingers MF are a plurality of the bit lines BL and a source line SL. Each of the memory fingers MF is connected to the column control circuit 2 via the bit lines BL, and is connected to an unillustrated source line driver via the source line SL.

The memory finger MF comprises a plurality of memory units MU that have their one ends connected to the bit lines BL and have their other ends connected to the source line SL via a source contact LI. The memory units MU included in one memory finger MF are all connected to different bit lines BL.

As shown in FIG. 2, the memory unit MU comprises a plurality of the memory cells MC connected in series. As will be mentioned later, the memory cell MC comprises a semiconductor layer, a charge accumulation layer, and a control gate, and accumulates a charge in the charge accumulation layer based on a voltage applied to the control gate, thereby changing a threshold value of the memory cell MC. Note that hereafter, the plurality of memory cells MC connected in series will be called a "memory string MS". The row control circuit 3 transfers a voltage to a certain word line WL, thereby transferring this voltage to the control gate of a certain memory cell MC in the memory string MS.

As shown in FIG. 2, commonly connected to the control gates of pluralities of the memory cells MC configuring different memory strings MS are, respectively, the word lines WL. These pluralities of memory cells MC are connected to the row control circuit 3 via the word lines WL. Moreover, in the example shown in FIG. 2, the word lines WL are provided independently to each of the memory cells MC included in the memory unit MU, and are provided commonly for all of the memory units MU included in one memory block MB.

As shown in FIG. 2, the memory unit MU comprises a drain side select gate transistor STD connected between the memory string MS and the bit line BL. Connected to a control gate of the drain side select gate transistor STD is the drain side select gate line SGD. The drain side select gate line SGD is connected to the row control circuit 3, and selectively connects the memory string MS and the bit line BL based on an inputted signal. Moreover, in the example shown in FIG. 2, the drain side select gate line SGD is provided independently to each of the memory fingers MF, and is commonly connected to the control gates of all of the drain side select gate transistors STD in the memory finger MF. The row control circuit 3 selects a certain drain side select gate line SGD, thereby connecting all of the memory strings MS in a certain memory finger MF to the bit lines BL.

Moreover, as shown in FIG. 2, the memory unit MU comprises a source side select gate transistor STS and a lowermost layer source side select gate transistor STSb that are connected between the memory string MS and the source contact LI. Connected to a control gate of the source side select gate transistor STS is a source side select gate line SGS. In addition, connected to a control gate of the lowermost layer source side select gate transistor STSb is a lowermost layer source side select gate line SGSb. Moreover, in the example shown in FIG. 2, the source side select gate line SGS is commonly connected to all of the source side select gate transistors STS in the memory block MB. Similarly, the lowermost layer source side select gate line SGSb is commonly connected to all of the lowermost layer source side select gate transistors STSb in the memory block MB. The row control circuit 3 connects all of the memory strings MS in the memory block MB to the source line SL, based on an inputted signal.

Figure 3:
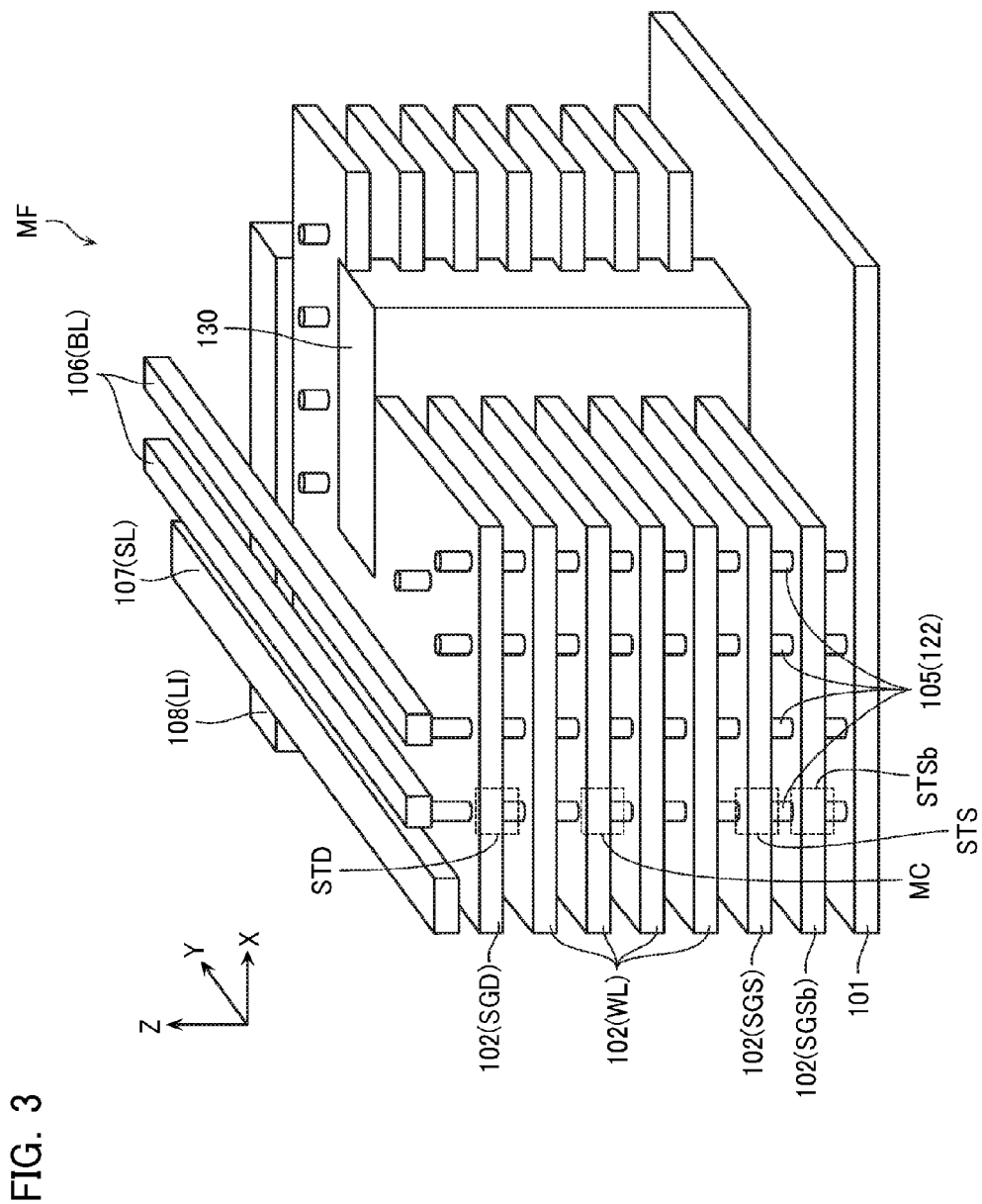
FIG. 3 is a perspective view showing a configuration of part of the same nonvolatile semiconductor memory device.

Next, a schematic configuration of the memory cell array 1 will be described with reference to FIG. 3. FIG. 3 is a schematic perspective view showing a configuration of part of the memory finger MF. Note that in FIG. 3, part of the configuration is omitted. Moreover, the configuration shown in FIG. 3 is merely an example, and a specific configuration may be appropriately changed.

As shown in FIG. 3, the memory finger MF comprises: a substrate 101; and a plurality of conductive layers 102 stacked in a Z direction on the substrate 101. In addition, the memory finger MF includes a plurality of memory columnar bodies 105 extending in the Z direction. As shown in FIG. 3, an intersection of the conductive layer 102 and the memory columnar body 105 functions as the lowermost layer source side select gate transistor STSb, the source side select gate transistor STS, the memory cell MC, or the drain side select gate transistor STD. The conductive layer 102 is configured from a conductive layer of the likes of tungsten (W) or polysilicon, for example, and functions as each of the word line WL and control gate electrode of the memory cell MC, the source side select gate line SGS and control gate electrode of the source side select gate transistor STS, the drain side select gate line SGD and control gate electrode of the drain side select gate transistor STD, or the lowermost layer source side select gate line SGSb and control gate electrode of the lowermost layer source side select gate transistor STSb.

In addition, as shown in FIG. 3, the memory finger MF comprises a conductive layer 108. The conductive layer 108 faces side surfaces in a Y direction of the plurality of conductive layers 102, and has a plate-like shape extending in an X direction and the Y direction. Moreover, the conductive layer 108 has a plate-like shape having the X direction as its longitudinal direction. A lower end of the conductive layer 108 contacts the substrate 101. The conductive layer 108 is configured from a conductive layer of the likes of tungsten (W), for example, and functions as the source contact LI.

In addition, as shown in FIG. 3, the memory finger MF comprises a plurality of conductive layers 106 and a conductive layer 107 that are positioned above the plurality of conductive layers 102 and memory columnar bodies 105, are arranged in plurality in the X direction, and extend in the Y direction. The memory columnar bodies 105 are respectively connected to lower surfaces of the conductive layers 106. The conductive layer 106 is configured from a conductive layer of the likes of tungsten (W), for example, and functions as the bit line BL. Moreover, the conductive layer 108 is connected to a lower surface of the conductive layer 107. The conductive layer 107 is configured from a conductive layer of the likes of tungsten (W), for example, and functions as the source line SL.

In addition, as shown in FIG. 3, the memory finger MF comprises a buckling suppressing layer 130 whose side surfaces in the X direction and the Y direction are surrounded by the stacked body configured from the plurality of conductive layers 102. The buckling suppressing layer 130 is an insulator provided along the Z direction, and faces the plurality of conductive layers 102. Moreover, the buckling suppressing layer 130 is provided along the X direction and has a width in the X direction which is larger than that of the memory columnar body 105. The buckling suppressing layer 130 can be formed from a variety of materials, but may be formed from the likes of silicon oxide ($SiO_2$), for example.

Figure 4:
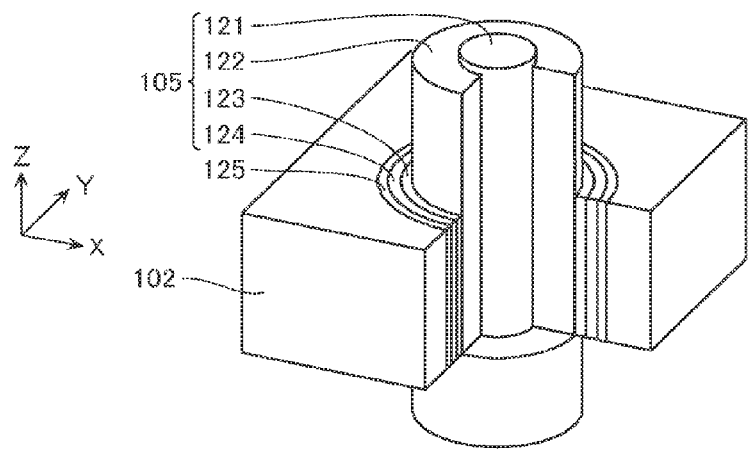
FIG. 4 is a perspective view showing a configuration of part of the same nonvolatile semiconductor memory device.

Next, a schematic configuration of the memory cell MC will be described with reference to FIG. 4. FIG. 4 is a schematic perspective view showing the configuration of the memory cell MC. Note that FIG. 4 shows the configuration of the memory cell MC, but the lowermost layer source side select gate transistor STSb, the source side select gate transistor STS, and the drain side select gate transistor STD may also be configured similarly to the memory cell MC. Note that in FIG. 4, part of the configuration is omitted.

As shown in FIG. 4, the memory cell MC is provided at an intersection of the conductive layer 102 and the memory columnar body 105. The memory columnar body 105 comprises: a core insulating layer 121; and a semiconductor layer 122, a tunnel insulating layer 123, and a charge accumulation layer 124 that are stacked on a sidewall of the core insulating layer 121. Furthermore, a block insulating layer 125 is provided between the memory columnar body 105 and the conductive layer 102.

The core insulating layer 121 is configured from an insulating layer of the likes of silicon oxide ($SiO_2$), for example. The semiconductor layer 122 is configured from a semiconductor layer of the likes of polysilicon, for example, and functions as a channel of the memory cell MC, the lowermost layer source side select gate transistor STSb, the source side select gate transistor STS, and the drain side select gate transistor STD. The tunnel insulating layer 123 is configured from an insulating layer of the likes of silicon oxide ($SiO_2$), for example. The charge accumulation layer 124 is configured from an insulating layer capable of accumulating a charge, of the likes of silicon nitride (SiN), for example. The block insulating layer 125 is configured from an insulating layer of the likes of silicon oxide ($SiO_2$), for example.

Figure 5:
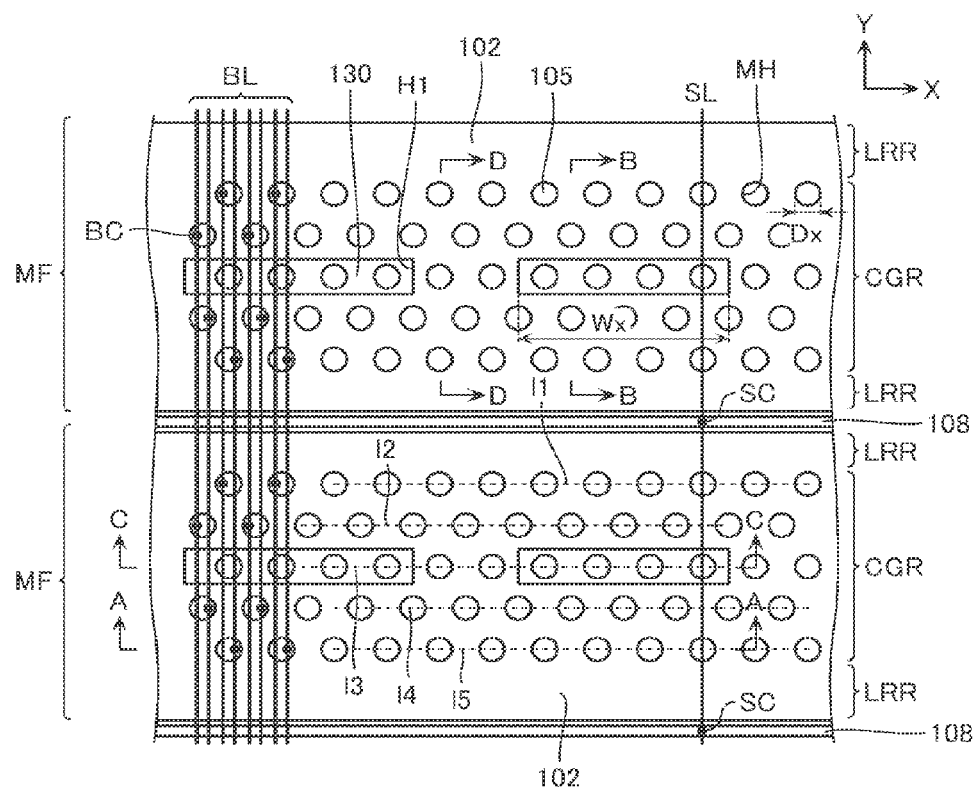
FIG. 5 is a plan view showing a configuration of part of the same nonvolatile semiconductor memory device.
Figure 6:
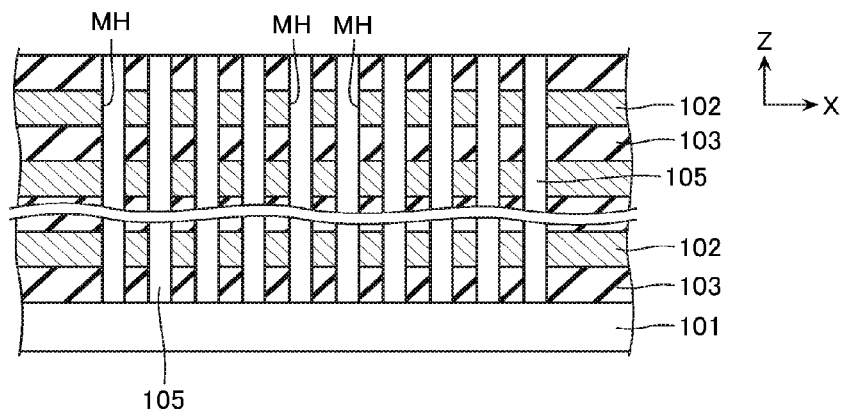
FIG. 6 is a cross-sectional view showing a configuration of part of the same nonvolatile semiconductor memory device.
Figure 7:
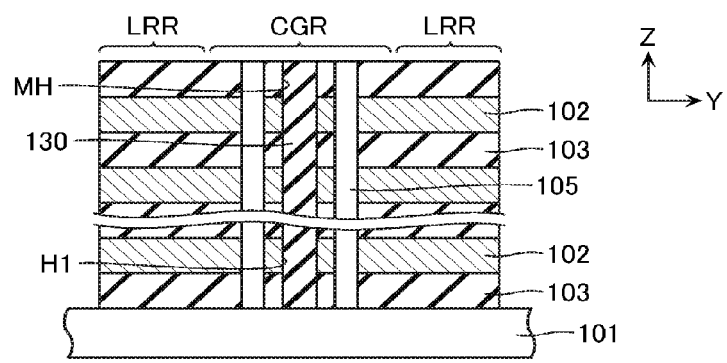
FIG. 7 is a cross-sectional view showing a configuration of part of the same nonvolatile semiconductor memory device.
Figure 8:
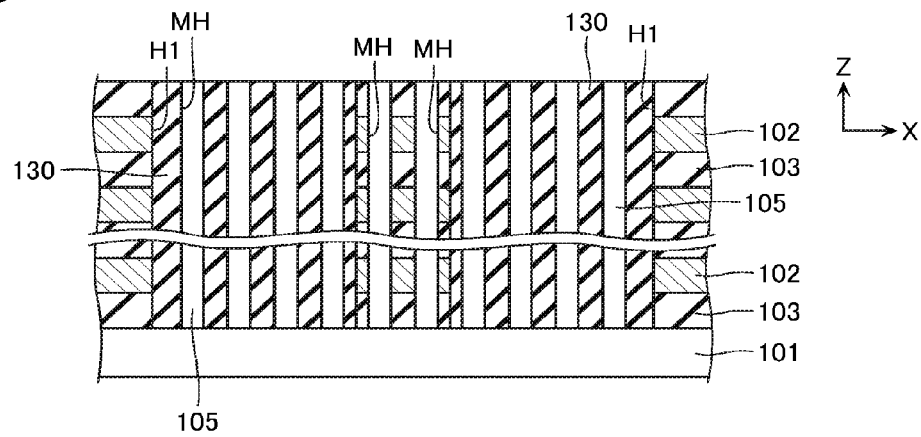
FIG. 8 is a cross-sectional view showing a configuration of part of the same nonvolatile semiconductor memory device.
Figure 9:
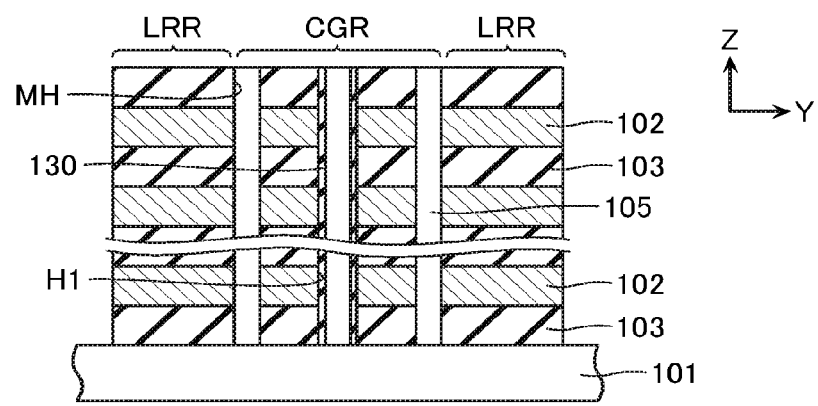
FIG. 9 is a cross-sectional view showing a configuration of part of the same nonvolatile semiconductor memory device.

Next, the nonvolatile semiconductor memory device according to the present embodiment will be described in more detail with reference to FIGS. 5 to 9. FIG. 5 is a plan view showing a configuration of the same nonvolatile semiconductor memory device. FIG. 6 is a cross-sectional view showing the configuration of the same nonvolatile semiconductor memory device, and shows a cross-section taken along the line AA of FIG. 5. FIG. 7 is a cross-sectional view showing the configuration of the same nonvolatile semiconductor memory device, and shows a cross-section taken along the line BB of FIG. 5. FIG. 8 is a cross-sectional view showing the configuration of the same nonvolatile semiconductor memory device, and shows a cross-section taken along the line CC of FIG. 5. FIG. 9 is a cross-sectional view showing the configuration of the same nonvolatile semiconductor memory device, and shows a cross-section taken along the line DD of FIG. 5.

As shown in FIG. 5, in the nonvolatile semiconductor memory device according to the present embodiment, a plurality of the conductive layers 102 having the X direction as their longitudinal direction are arranged in the Y direction. Moreover, provided between the conductive layers 102 adjacent in the Y direction, via an unillustrated inter-layer insulating layer, is the conductive layer 108 (source contact LI). Note that the conductive layer 108 is connected to the source line SL via a source line contact SC.

As shown in FIG. 5, an end in the Y direction of the conductive layer 102 is provided with a low resistance region LRR that extends in the X direction. Furthermore, provided between a pair of the low resistance regions LRR is a control gate region CGR. Now, the control gate region CGR is provided with a plurality of memory holes MH. In other words, the control gate region CGR is provided with a portion facing the memory columnar bodies 105. Furthermore, the control gate region CGR is provided with a through hole H1. On the other hand, the low resistance region LRR is not provided with either the memory hole MH or the through hole H1. Therefore, an electrical resistance value of the low resistance region LRR is lower compared to an electrical resistance value in the control gate region CGR.

As shown in FIGS. 6 to 9, the memory hole MH and the through hole H1 are through holes that penetrate in the Z direction the stacked plurality of conductive layers 102 and inter-layer insulating layers 103 positioned between these conductive layers 102. As shown in FIGS. 6 and 7, the memory columnar body 105 is provided inside the memory hole MH. Moreover, as shown in FIGS. 8 and 9, the buckling suppressing layer 130 is provided inside the through hole H1.

As shown in FIG. 5, the memory holes MH are disposed staggered. Furthermore, pluralities of the memory holes MH are each provided along imaginary lines 11 to 15 that are arranged in the Y direction and extend in the X direction. Moreover, the through hole H1 is positioned in a central portion in the Y direction of the conductive layer 102. That is, the through hole H1 has the X direction as its longitudinal direction and is provided in plurality along the imaginary line 13. Therefore, the buckling suppressing layer 130 and the memory columnar body 105 are adjacent in the X direction on the imaginary line 13. Moreover, a width $W_x$ in the X direction of the through hole H1 and the buckling suppressing layer 130 is larger than a width $D_x$ in the X direction of the memory hole MH and the memory columnar body 105. For example, in the example shown in FIG. 5, the width in the X direction of the buckling suppressing layer 130 is long enough to include four memory columnar bodies 105, and a width in the Y direction of the buckling suppressing layer 130 has a length sufficient to include one memory columnar body 105. Note that in the example shown in FIGS. 5, 8, and 9, the buckling suppressing layer 130 also has the memory hole MH formed therein, and that memory hole MH also has the memory columnar body 105 embedded therein.

As shown in FIG. 5, the memory columnar bodies 105 provided along the imaginary lines 11, 12, 14, and 15 are connected to the bit line BL via a bit line contact BC. On the other hand, the memory columnar bodies 105 provided along the imaginary line 13 are not connected to the bit line BL. However, the bit line BL may be connected to one positioned between the buckling suppressing layers 130 adjacent in the X direction, of the memory columnar bodies 105 provided along the imaginary line 13.

As described with reference to FIG. 3, the semiconductor memory device according to the present embodiment comprises the buckling suppressing layer 130 surrounded by the stacked body of conductive layers 102 in the XY plane parallel to the substrate 101. Moreover, this buckling suppressing layer 130 has a width $W_x$ in the X direction which is larger than the width $D_x$ in the X direction of the memory columnar body 105. Therefore, as will be described in detail later, the semiconductor memory device according to the present embodiment can be easily manufactured, while securing mechanical strength in a manufacturing step.

Moreover, as described with reference to FIG. 5, the conductive layer 102 according to the present embodiment comprises: the low resistance region LRR provided along the X direction; and the control gate region CGR provided along this low resistance region LRR and provided with a portion facing the memory columnar body 105. Now, as mentioned above, the electrical resistance value of the low resistance region LRR is lower compared to the electrical resistance value in the control gate region CGR. Therefore, a majority of a current flowing in the conductive layer 102 passes through this low resistance region LRR. Now, the through hole H1 according to the present embodiment is provided in the control gate region CGR, not the low resistance region LRR. Therefore, it is possible to prevent an increase in electrical resistance of the conductive layer 102.

In addition, as described with reference to FIG. 5, pluralities of the memory holes MH according to the present embodiment are each provided along the plurality of imaginary lines 11 to 15 arranged in the Y direction and extending in the X direction. Furthermore, the through hole H1 according to the present embodiment has the X direction as its longitudinal direction and is provided along the imaginary line 13. Therefore, it is possible to suppress decrease in cross-sectional area in the YZ plane of the conductive layer 102 and minimize increase in electrical resistance. Moreover, by connecting to the bit line BL extending in the Y direction ones positioned on the imaginary lines 11, 12, 14, and 15, of the plurality of memory columnar bodies 105 and using them as the memory string MS, it is possible to effectively utilize area in the XY plane of the conductive layer 102 and suppress a reduction in bit number per area.

Moreover, as described with reference to FIG. 5, the buckling suppressing layer 130 according to the present embodiment also has the memory hole MH formed therein, and that memory hole MH also has the memory columnar body 105 embedded therein. In other words, the buckling suppressing layer 130 includes the memory columnar bodies 105 on its inside and surrounds these memory columnar bodies 105 in the XY plane. As will be described later, the semiconductor memory device comprising such a configuration can be easily manufactured. Note that, the buckling suppressing layer 130 may be formed only from an insulating layer of the likes of $SiO_2$.

[Method of Manufacturing]

Figure 10:
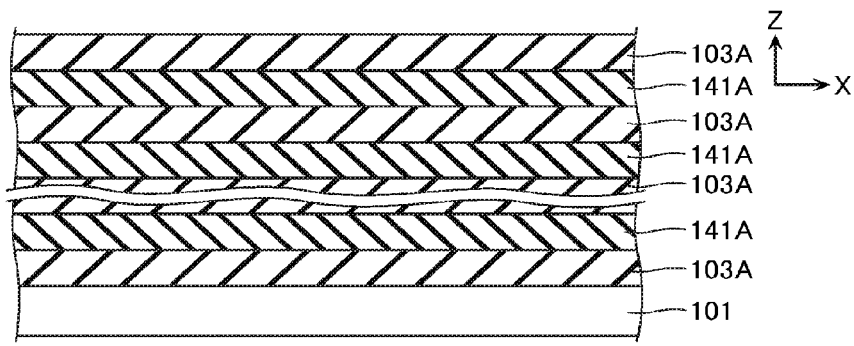
FIG. 10 is a cross-sectional view showing a manufacturing step of the same nonvolatile semiconductor memory device.
Figure 11:
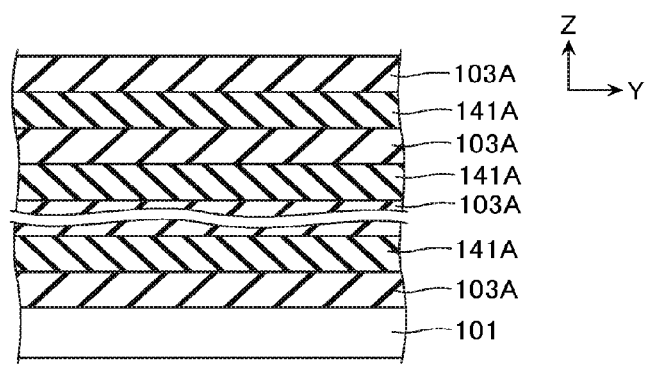
FIG. 11 is a cross-sectional view showing a manufacturing step of the same nonvolatile semiconductor memory device.

Next, a method of manufacturing a nonvolatile semiconductor memory device according to the first embodiment will be described with reference to FIGS. 10 to 32. FIGS. 10 and 11 are cross-sectional views for explaining the method of manufacturing according to the first embodiment. FIGS. 12, 15, 18, 21, 24, 27, and 30 are plan views for explaining the method of manufacturing according to the same embodiment. Moreover, FIGS. 13, 14, 16, 17, 19, 20, 22, 23, 25, 26, 28, 29, 31, and 32 are cross-sectional views for explaining the same method of manufacturing, and respectively correspond to the above-mentioned plan views.

As shown in FIGS. 10 and 11, in the method of manufacturing according to the present embodiment, a plurality of sacrifice layers 141A and inter-layer insulating layers 103A which will be the inter-layer insulating layers 103 are stacked alternately on the substrate 101. Note that the inter-layer insulating layer 103A is configured from, for example, silicon oxide ($SiO_2$). Moreover, the sacrifice layer 141A is configured from, for example, silicon nitride (SiN).

Figure 12:
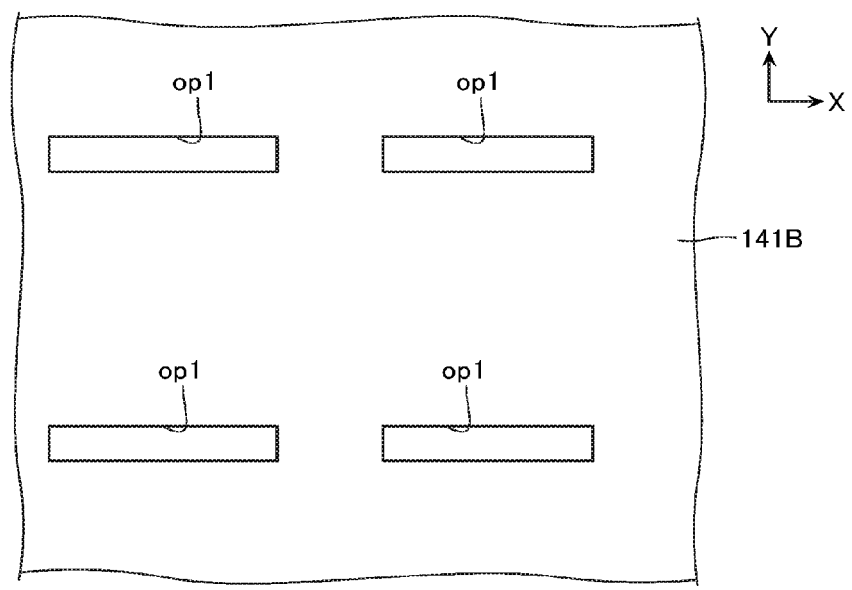
FIG. 12 is a plan view showing a manufacturing step of the same nonvolatile semiconductor memory device.
Figure 13:
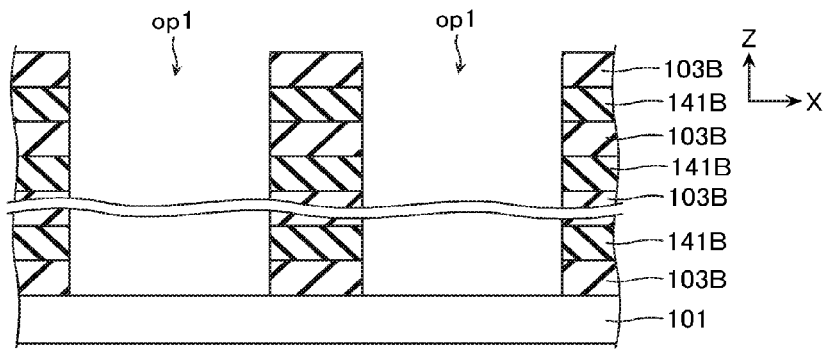
FIG. 13 is a cross-sectional view showing a manufacturing step of the same nonvolatile semiconductor memory device.
Figure 14:
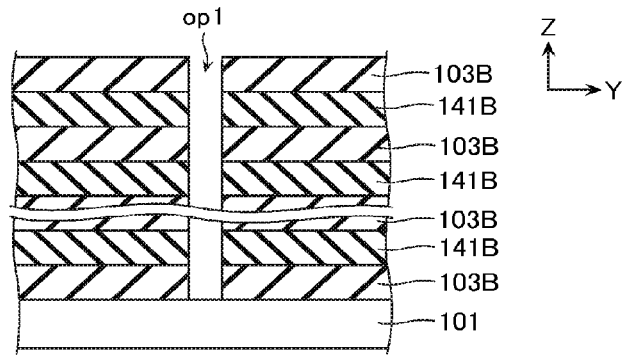
FIG. 14 is a cross-sectional view showing a manufacturing step of the same nonvolatile semiconductor memory device.

Next, as shown in FIGS. 12 to 14, an opening op1 penetrating the inter-layer insulating layer 103A and the sacrifice layer 141A, is formed, and an inter-layer insulating layer 103B and sacrifice layer 141B provided with the opening op1, are formed. Note that the opening op1 will be the through hole H1.

Figure 15:
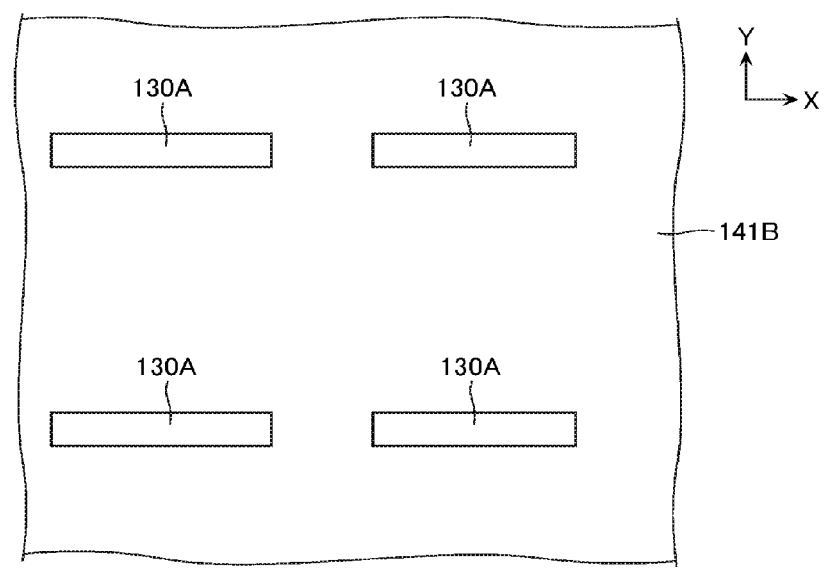
FIG. 15 is a plan view showing a manufacturing step of the same nonvolatile semiconductor memory device.
Figure 16:
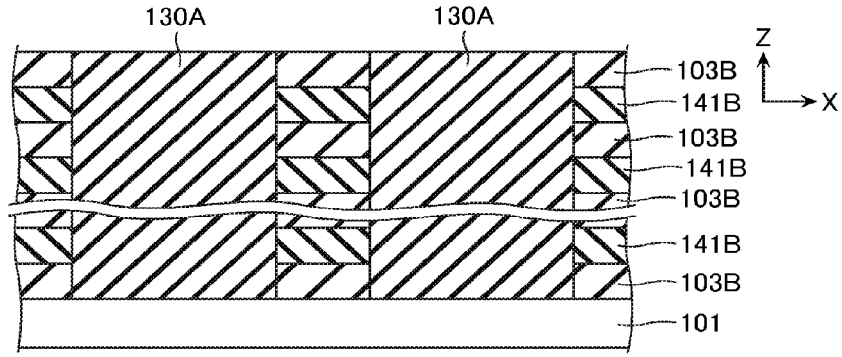
FIG. 16 is a cross-sectional view showing a manufacturing step of the same nonvolatile semiconductor memory device.
Figure 17:
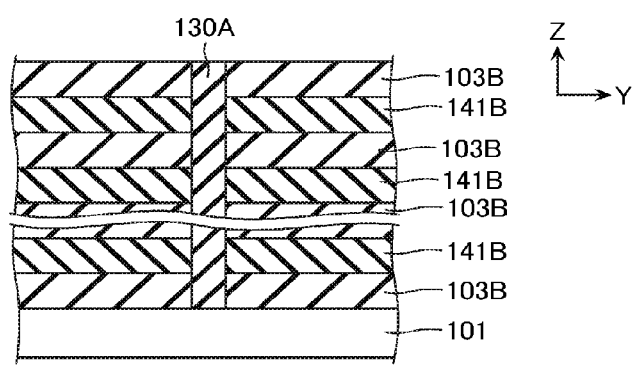
FIG. 17 is a cross-sectional view showing a manufacturing step of the same nonvolatile semiconductor memory device.

Next, as shown in FIGS. 15 to 17, the inside of the opening op1 is embedded with an insulating layer 130A which will be the buckling suppressing layer 130. The insulating layer 130A is formed from an insulating layer of the likes of silicon oxide ($SiO_2$), for example.

Figure 18:
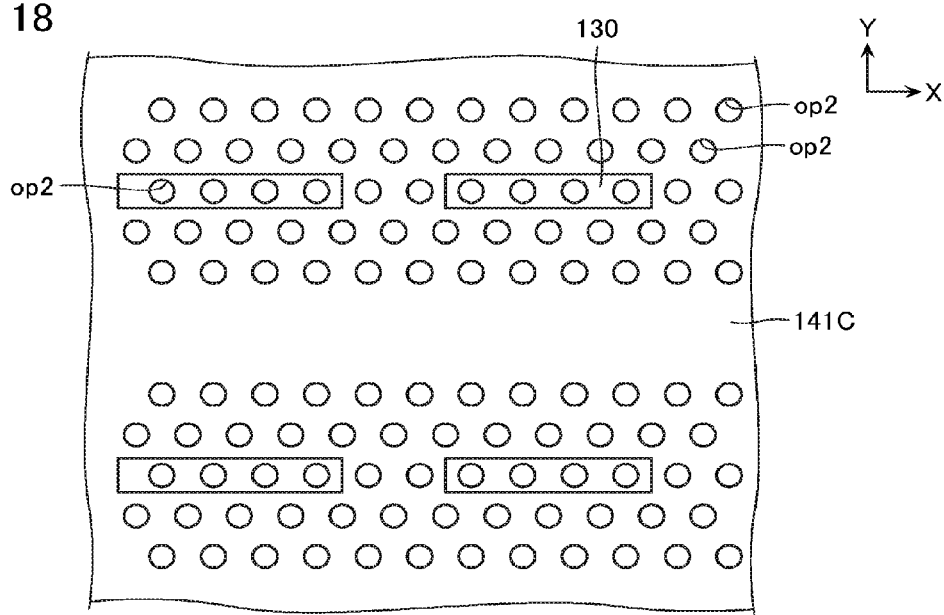
FIG. 18 is a plan view showing a manufacturing step of the same nonvolatile semiconductor memory device.
Figure 19:
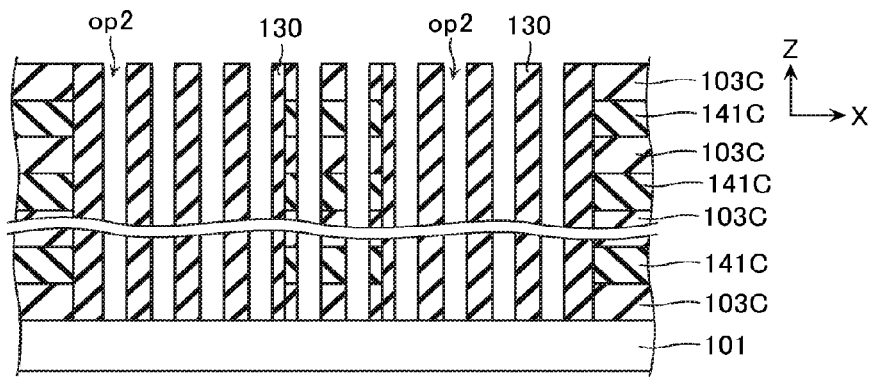
FIG. 19 is a cross-sectional view showing a manufacturing step of the same nonvolatile semiconductor memory device.
Figure 20:
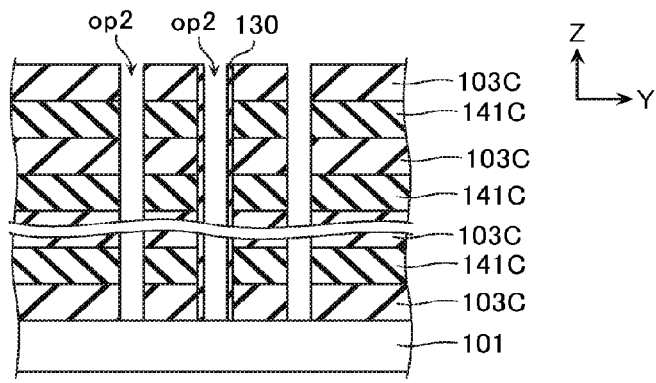
FIG. 20 is a cross-sectional view showing a manufacturing step of the same nonvolatile semiconductor memory device.

Next, as shown in FIGS. 18 to 20, an opening op2 penetrating the inter-layer insulating layer 103B, the sacrifice layer 141B, and the insulating layer 130A, is formed, and an inter-layer insulating layer 103C, a sacrifice layer 141C, and the buckling suppressing layer 130 that are provided with the opening op2, are formed. Note that the opening op2 will be the memory hole MH. Moreover, the opening op2 is formed at fixed intervals, regardless of presence/absence of the insulating layer 130A.

Figure 21:
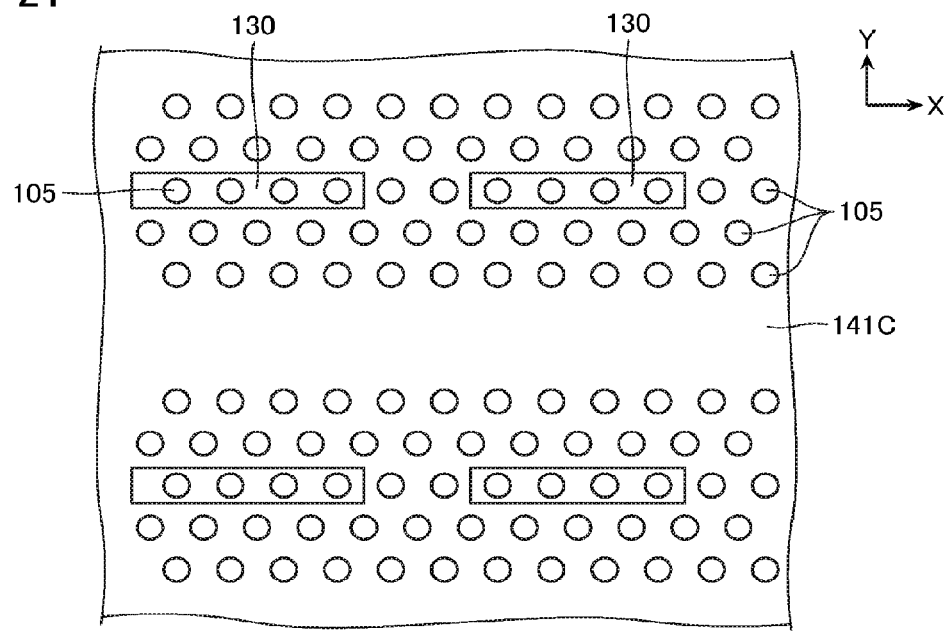
FIG. 21 is a plan view showing a manufacturing step of the same nonvolatile semiconductor memory device.
Figure 22:
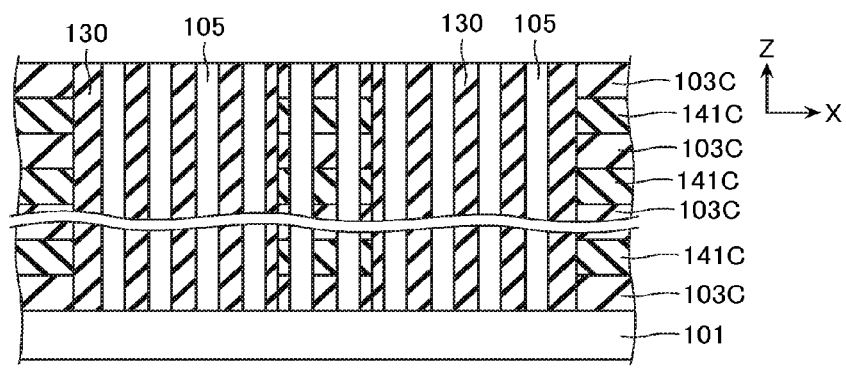
FIG. 22 is a cross-sectional view showing a manufacturing step of the same nonvolatile semiconductor memory device.
Figure 23:
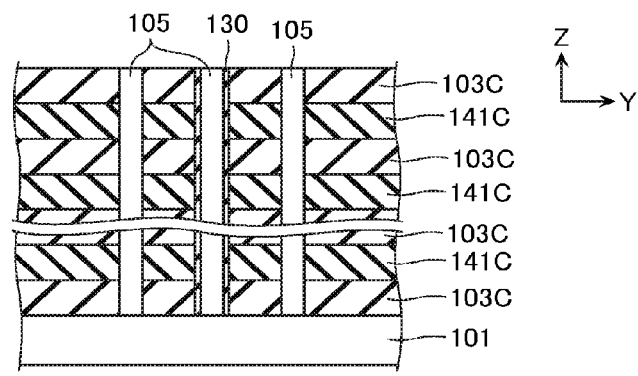
FIG. 23 is a cross-sectional view showing a manufacturing step of the same nonvolatile semiconductor memory device.

Next, as shown in FIGS. 21 to 23, the memory columnar body 105 is formed inside the opening op2. For example, the charge accumulation layer 124, tunnel insulating layer 123, and semiconductor layer 122 described with reference to FIG. 4 are formed on the inner wall of the opening op2, and the core insulating layer 121 is embedded therein.

Figure 24:
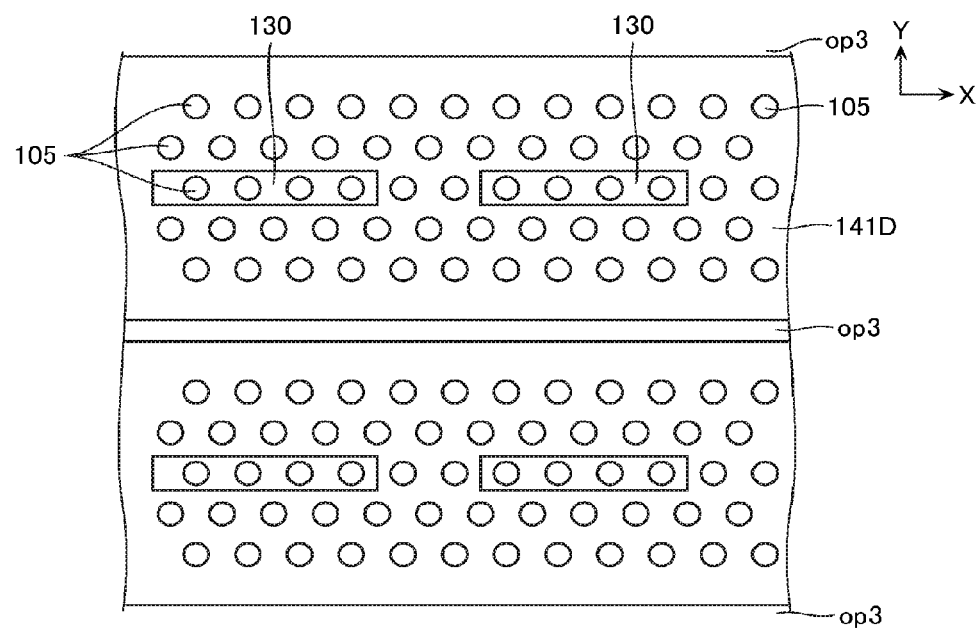
FIG. 24 is a plan view showing a manufacturing step of the same nonvolatile semiconductor memory device.
Figure 25:
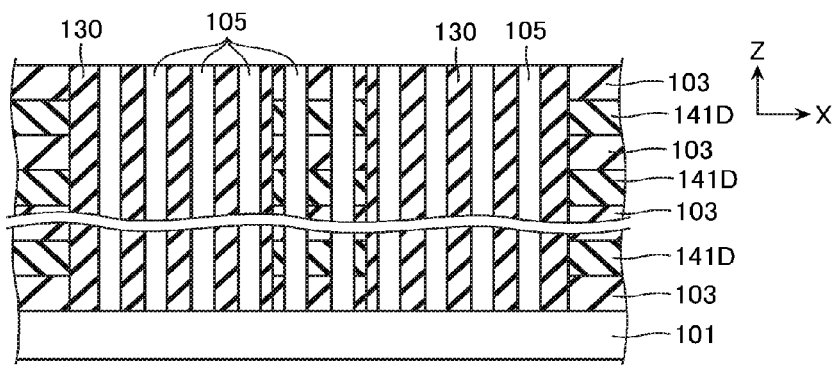
FIG. 25 is a cross-sectional view showing a manufacturing step of the same nonvolatile semiconductor memory device.
Figure 26:
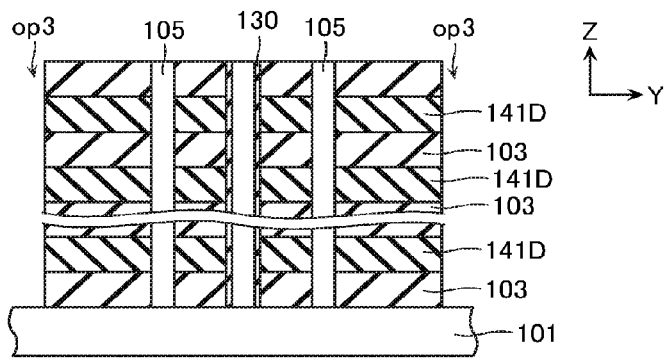
FIG. 26 is a cross-sectional view showing a manufacturing step of the same nonvolatile semiconductor memory device.

Next, as shown in FIGS. 24 to 26, an opening op3 that divides the inter-layer insulating layer 103C and sacrifice layer 141C in the Y direction, is formed, and the inter-layer insulating layer 103 and a sacrifice layer 141D divided in the Y direction, are formed.

Figure 27:
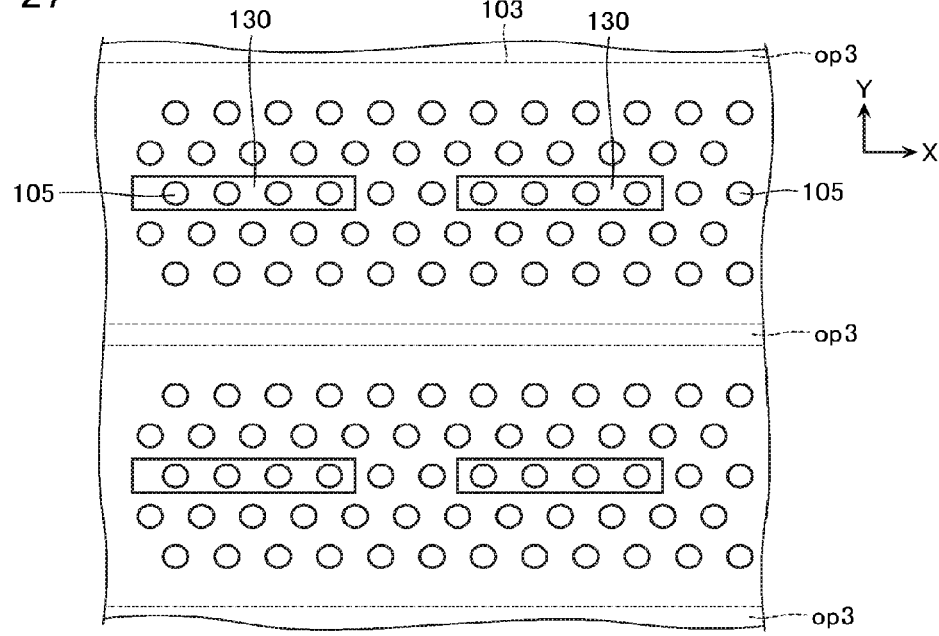
FIG. 27 is a plan view showing a manufacturing step of the same nonvolatile semiconductor memory device.
Figure 28:
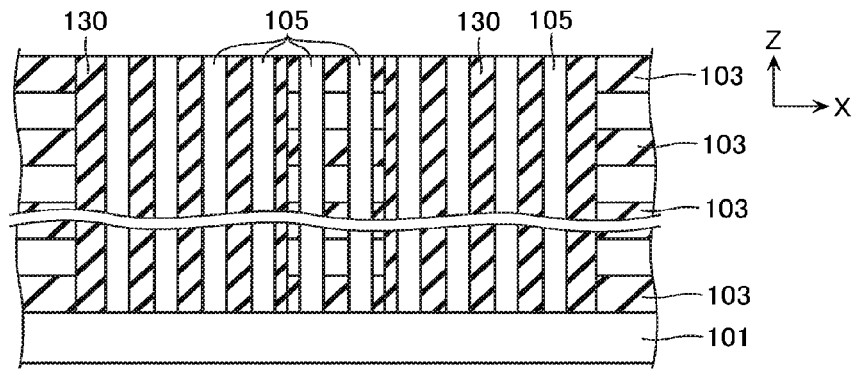
FIG. 28 is a cross-sectional view showing a manufacturing step of the same nonvolatile semiconductor memory device.
Figure 29:
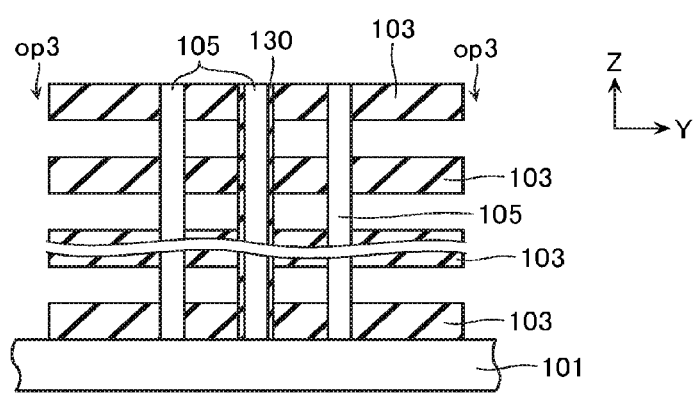
FIG. 29 is a cross-sectional view showing a manufacturing step of the same nonvolatile semiconductor memory device.

Next, as shown in FIGS. 27 to 29, in the same method of manufacturing, the sacrifice layer 141D is removed via the opening op3.

Figure 30:
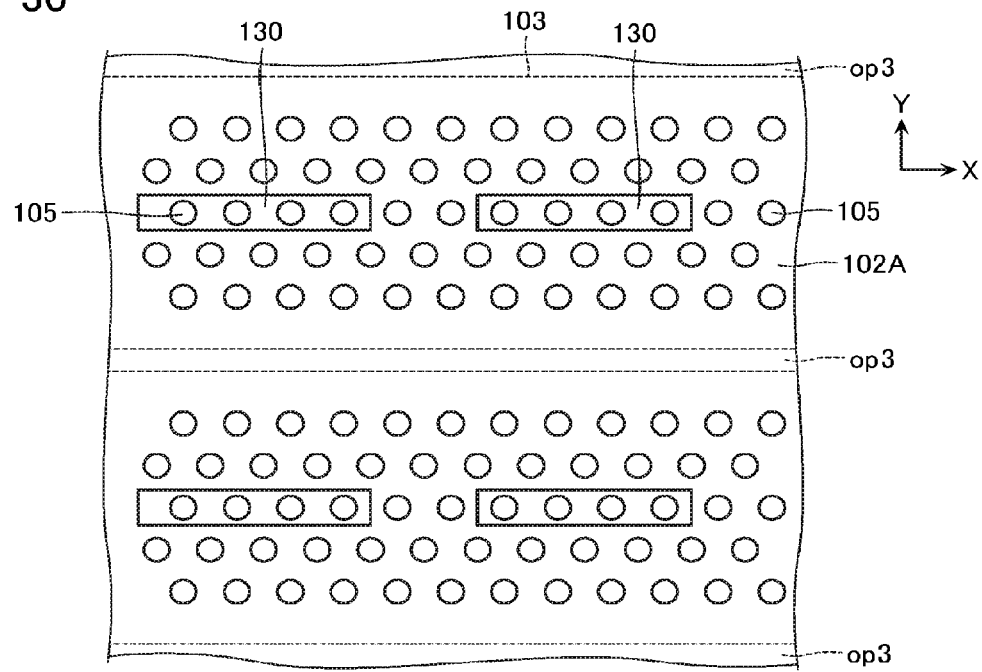
FIG. 30 is a plan view showing a manufacturing step of the same nonvolatile semiconductor memory device.
Figure 31:
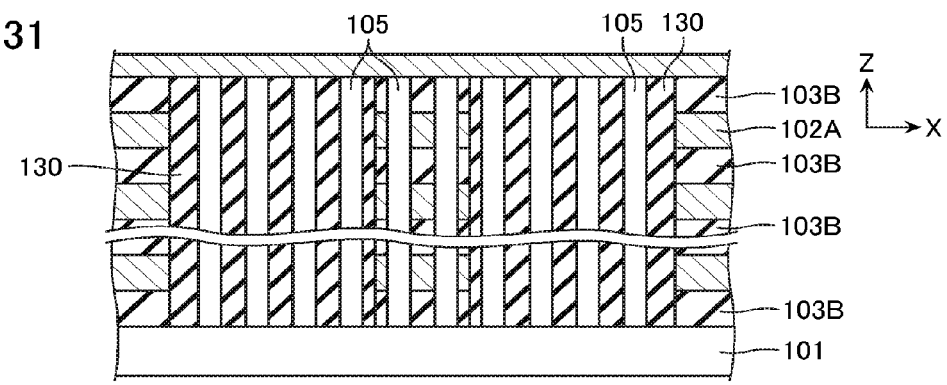
FIG. 31 is a cross-sectional view showing a manufacturing step of the same nonvolatile semiconductor memory device.
Figure 32:
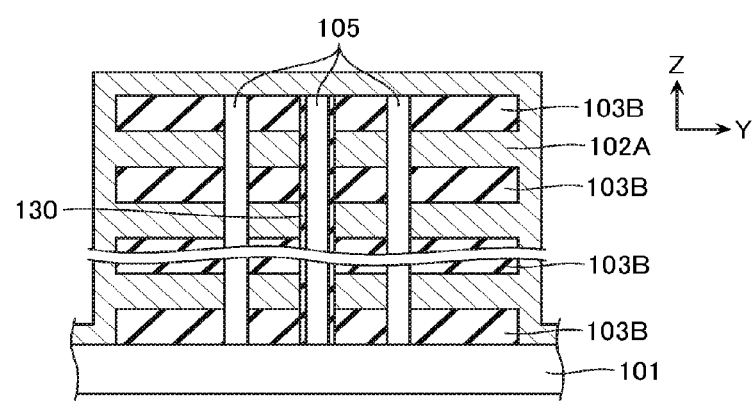
FIG. 32 is a cross-sectional view showing a manufacturing step of the same nonvolatile semiconductor memory device.

Next, as shown in FIGS. 30 to 32, a conductive layer formation layer 102A forming the conductive layer 102, is formed. The conductive layer formation layer 102A is formed between the stacked inter-layer insulating layers 103, via the opening op3.

Next, as shown in FIGS. 5 to 7, a portion covering an upper surface and sidewall of the inter-layer insulating layer 103, of the conductive layer 102A is removed, and the plurality of conductive layers 102 divided in the Z direction are formed. Next, an unillustrated insulating layer and the conductive layer 108 are formed in the opening op3. Furthermore, the bit line contact BC is formed on the memory columnar body 105, and the source line contact SC is formed on the conductive layer 108, and the bit line BL, source line SL, and so on, are formed. As a result, the nonvolatile semiconductor memory device according to the present embodiment is manufactured.

[Method of Manufacturing Semiconductor Memory Device According to Comparative Example]

Figure 33:
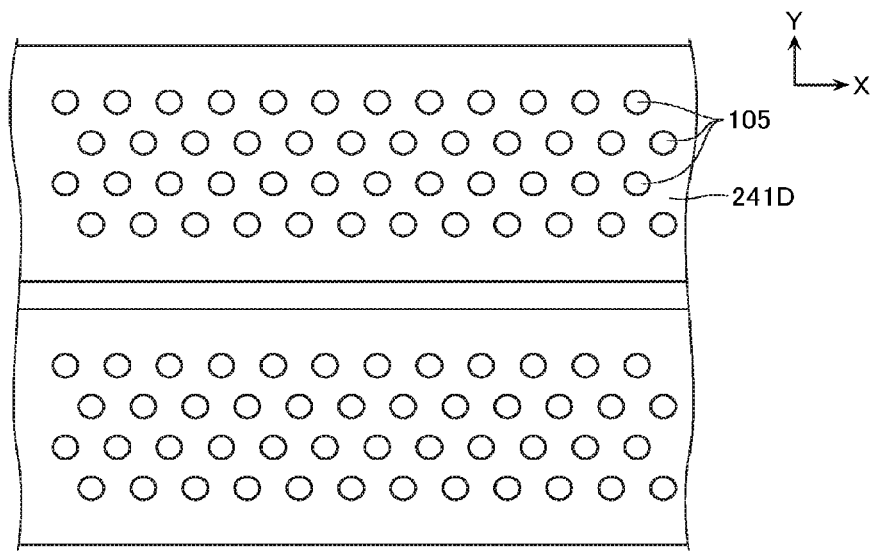
FIG. 33 is a plan view showing a manufacturing step of a nonvolatile semiconductor memory device according to a comparative example.

Next, a method of manufacturing a semiconductor memory device according to a comparative example will be described with reference to FIGS. 33 to 41. FIGS. 33 to 41 are views showing part of the method of manufacturing a semiconductor memory device according to the comparative example, FIG. 33 showing a plan view, and FIGS. 34 to 41 showing cross-sectional views. Note that in the description below, portions identical to those of the first embodiment are assigned with identical reference symbols to those assigned in the first embodiment, and descriptions thereof will be omitted.

The semiconductor memory device according to the comparative example is configured substantially similarly to the semiconductor memory device according to the first embodiment, but does not include the buckling suppressing layer 130, and is different in this respect. Moreover, in the method of manufacturing a semiconductor memory device according to the comparative example, the steps described with reference to FIGS. 12 to 17 are not performed, and in this respect also, the method of manufacturing according to the comparative example is different from the method of manufacturing according to the first embodiment.

Figure 34:
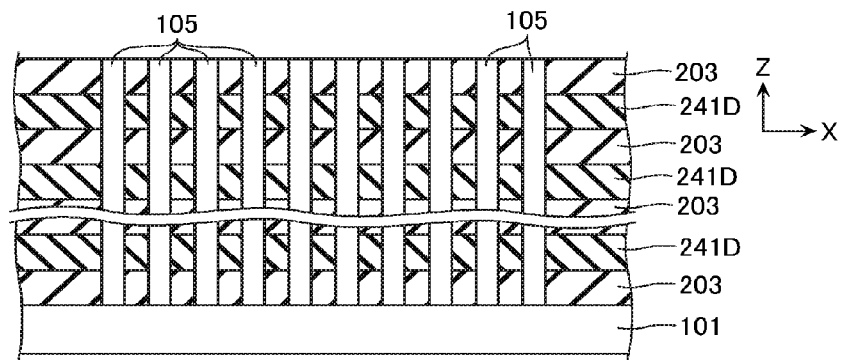
FIG. 34 is a cross-sectional view showing a manufacturing step of the same nonvolatile semiconductor memory device.
Figure 35:
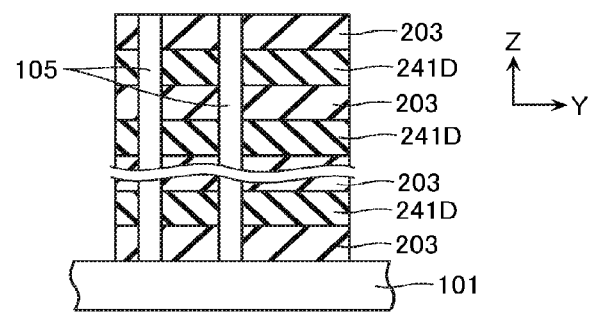
FIG. 35 is a cross-sectional view showing a manufacturing step of the same nonvolatile semiconductor memory device.

As shown in, for example, FIGS. 33 to 35, in the method of manufacturing according to the comparative example, steps corresponding to those of FIGS. 10 and 11, and 18 to 26 result in the forming of a configuration comprising: the substrate 101; an inter-layer insulating layer 203 and sacrifice layer 241D stacked above the substrate 101; and the memory columnar body 105 that has one end connected to the substrate 101 and penetrates a plurality of the inter-layer insulating layers 203 and sacrifice layers 241D.

Figure 36:
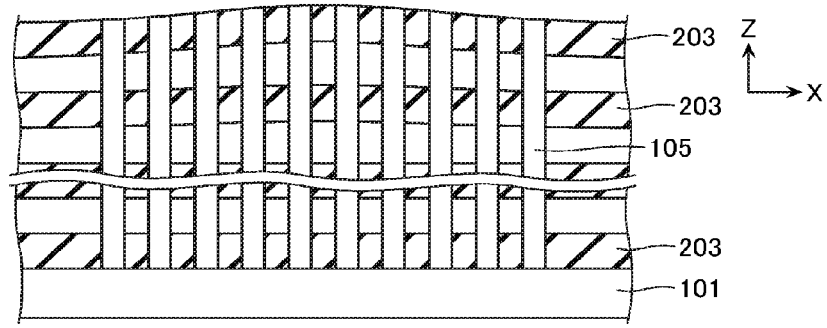
FIG. 36 is a cross-sectional view showing a manufacturing step of the same nonvolatile semiconductor memory device.
Figure 37:
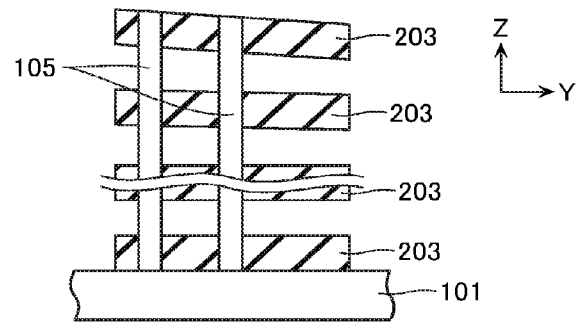
FIG. 37 is a cross-sectional view showing a manufacturing step of the same nonvolatile semiconductor memory device.

Next, as shown in FIGS. 36 and 37, the sacrifice layer 241D is removed. Here, when the inter-layer insulating layer 203 and the sacrifice layer 241D are stacked above the substrate 101, distortion between the inter-layer insulating layer 203 and the sacrifice layer 241D sometimes occurs. It is due to internal stresses of films having different formation conditions, and so on. Therefore, as shown in FIGS. 36 and 37, when the sacrifice layer 241D is removed, deformation sometimes happens between the inter-layer insulating layer 203. Such deformation may be lessened to a certain extent also by the memory columnar body 105, but since the memory columnar body 105 is formed in a column shape, its rigidity with respect to a force in the XY plane is low.

Figure 38:
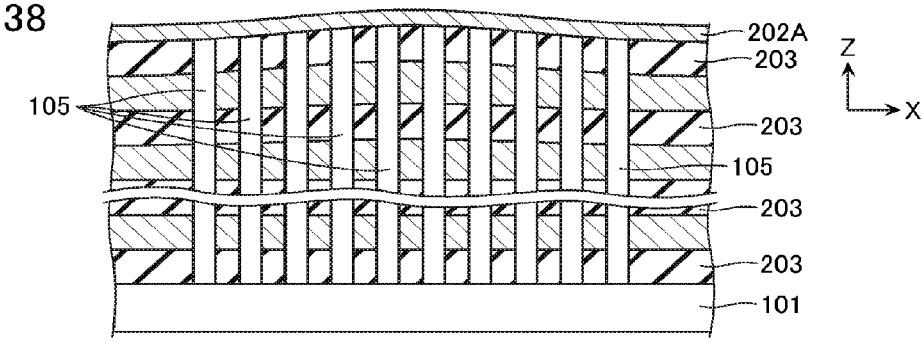
FIG. 38 is a cross-sectional view showing a manufacturing step of the same nonvolatile semiconductor memory device.
Figure 39:
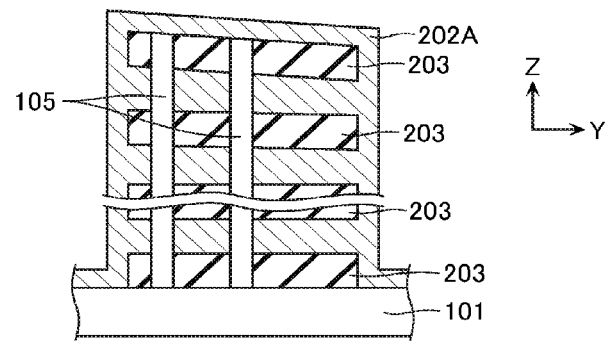
FIG. 39 is a cross-sectional view showing a manufacturing step of the same nonvolatile semiconductor memory device.

Next, as shown in FIGS. 38 and 39, a conductive layer formation layer 202A forming the word line and the control gate electrode, is formed. Now, the conductive layer formation layer 202A is formed from a metal such as tungsten (W).

Figure 40:
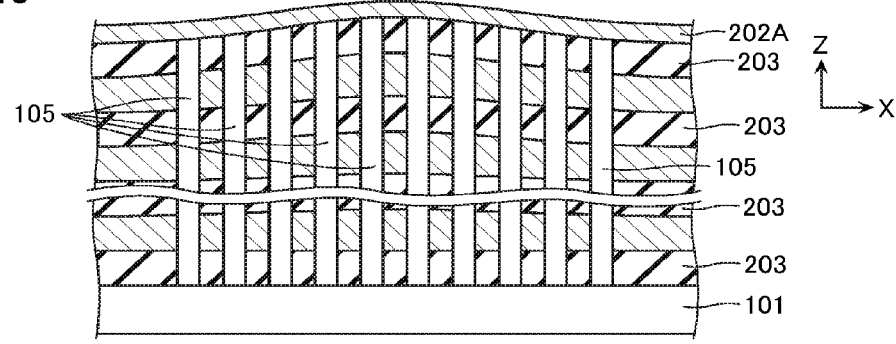
FIG. 40 is a cross-sectional view showing a manufacturing step of the same nonvolatile semiconductor memory device.
Figure 41:
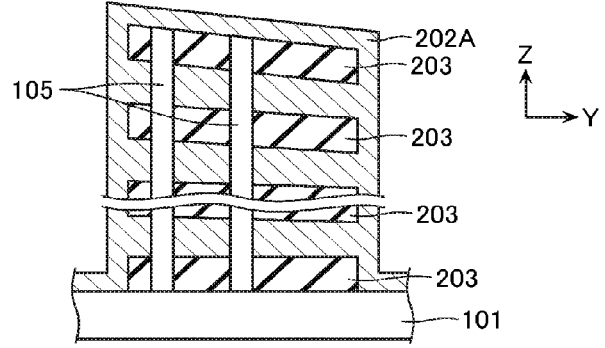
FIG. 41 is a cross-sectional view showing a manufacturing step of the same nonvolatile semiconductor memory device.

Now, as shown in FIGS. 40 and 41, after the conductive layer formation layer 202A has been formed and when the formed configuration is returned to room temperature, the conductive layer formation layer 202A configured from a metal such as tungsten contracts due to a thermal expansion relationship, whereby deformation further happens between the inter-layer insulating layers 203.

Now, as described with reference to FIGS. 10 to 17 and 27 to 29, in the method of manufacturing a semiconductor memory device according to the first embodiment, after forming the stacked body configured from the inter-layer insulating layer 103A and sacrifice layer 141A and before removing the sacrifice layer 141D, the opening op1 is formed in the stacked body and the buckling suppressing layer 130 is formed in the opening op1. Now, the width in the X direction of this buckling suppressing layer 130 is larger than the width in the X direction of the memory columnar body 105. Therefore, rigidity with respect to stress in the X direction of the buckling suppressing layer 130 is higher compared to that of the memory columnar body 105. Therefore, in the step described with reference to FIGS. 27 to 29, internal stress of the inter-layer insulating layer 103 can be absorbed, and deformation of the inter-layer insulating layer 103 can be suppressed. Note that when the sacrifice layer 141D is removed, the inter-layer insulating layer 103 has a structure having the X direction as its longitudinal direction. Therefore, internal stress occurring in the inter-layer insulating layer 103 acts mainly in the X direction. Therefore, by setting the longitudinal direction of the buckling suppressing layer 130 in the X direction, generation of buckling can be more suitably suppressed. Note that in the present embodiment, internal stress due to contraction of the conductive layer 102A can be absorbed and deformation of the inter-layer insulating layer 103 and conductive layer 102A can be suppressed also in the step described with reference to FIGS. 30 to 32.

Moreover, as described with reference to FIGS. 18 to 20, in the present embodiment, the opening op2 which will be the memory hole MH is formed at regular intervals, regardless of presence/absence of the insulating layer 130A. As a result, the memory hole MH can be formed accurately at a certain position.

[Second Embodiment]
[Semiconductor Memory Device]

Figure 42:
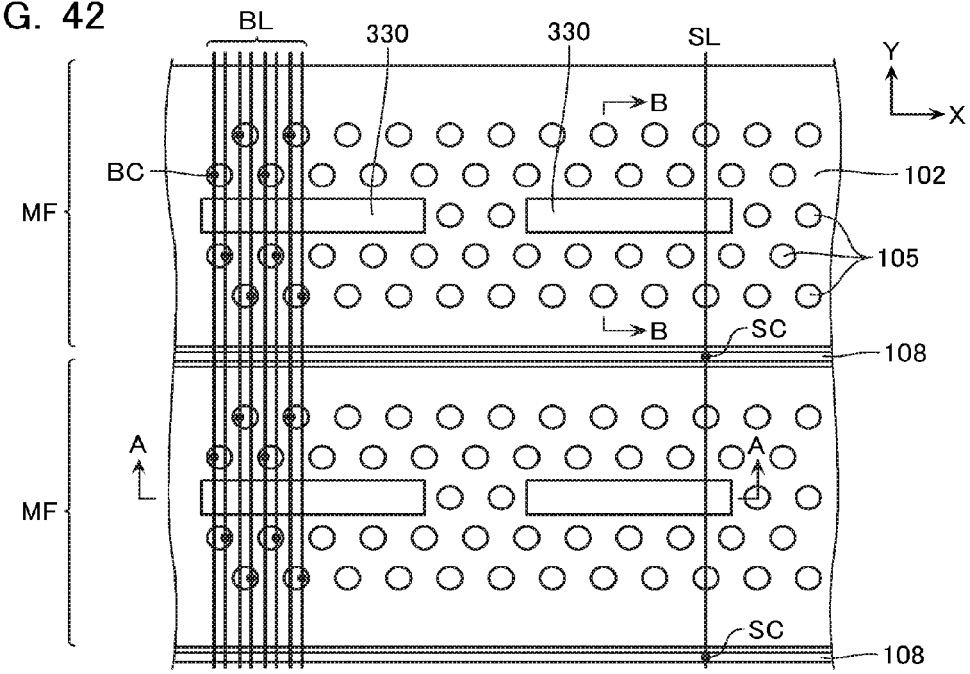
FIG. 42 is a plan view showing a configuration of part of a nonvolatile semiconductor memory device according to a second embodiment.
Figure 43:
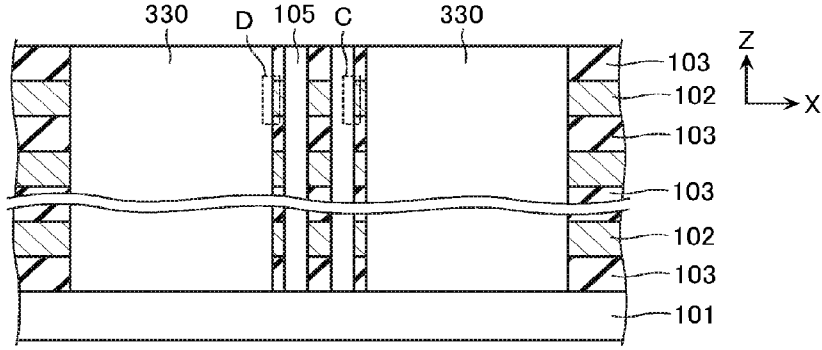
FIG. 43 is a cross-sectional view showing a configuration of part of the same nonvolatile semiconductor memory device.
Figure 44:
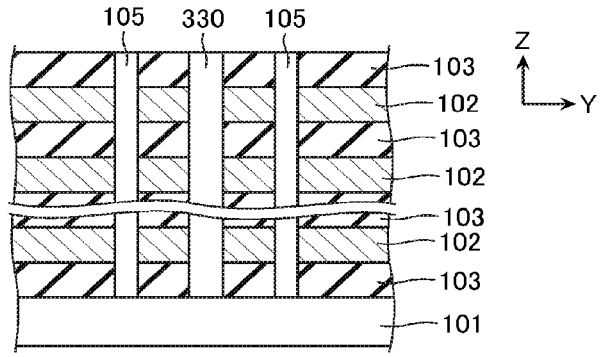
FIG. 44 is a cross-sectional view showing a configuration of part of the same nonvolatile semiconductor memory device.
Figure 45:
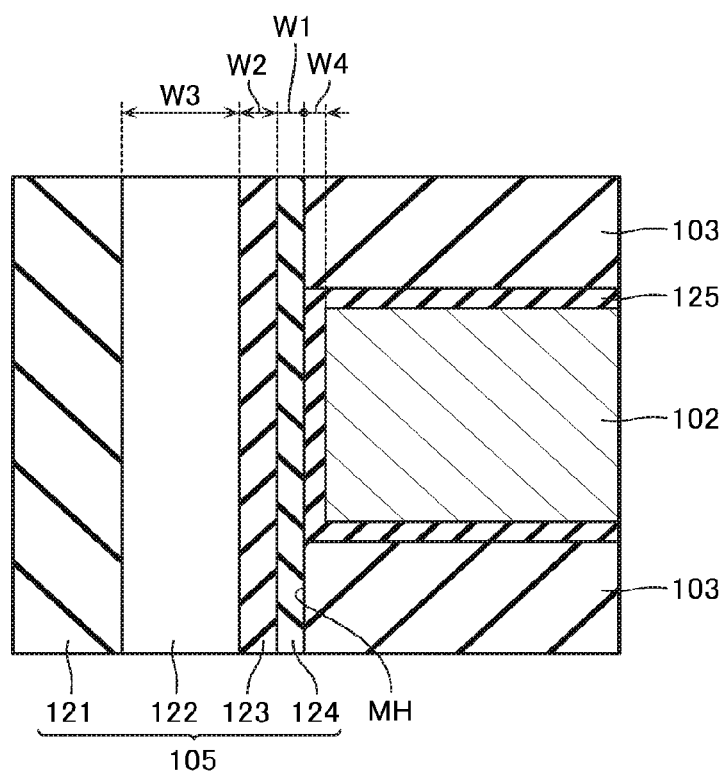
FIG. 45 is a cross-sectional view showing a configuration of part of the same nonvolatile semiconductor memory device.
Figure 46:
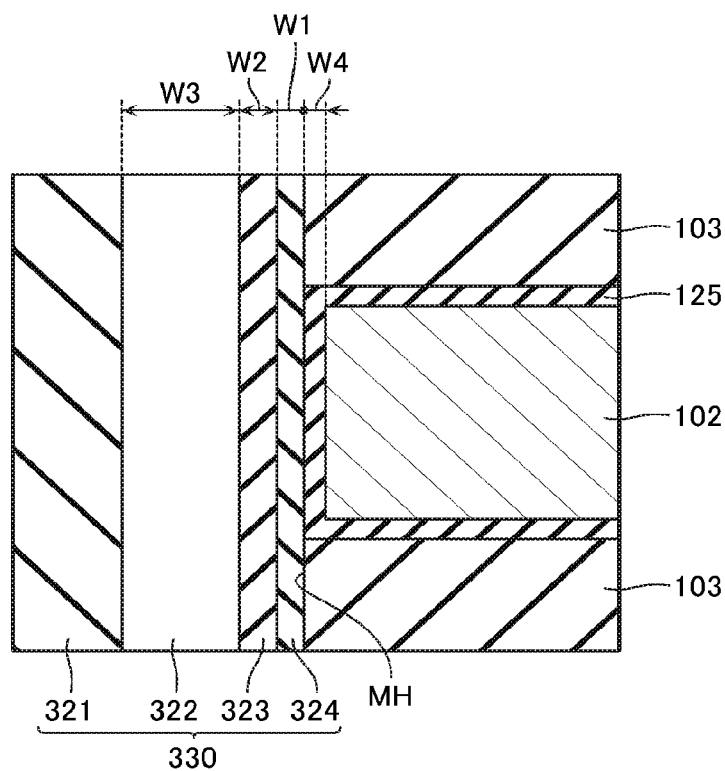
FIG. 46 is a cross-sectional view showing a configuration of part of the same nonvolatile semiconductor memory device.

Next, a configuration of a nonvolatile semiconductor memory device according to a second embodiment will be described with reference to FIGS. 42 to 46. FIG. 42 is a plan view showing the configuration of the same nonvolatile semiconductor memory device. FIG. 43 is a cross-sectional view showing the configuration of the same nonvolatile semiconductor memory device, and shows a cross-section taken along the line AA of FIG. 42. FIG. 44 is a cross-sectional view showing the configuration of the same nonvolatile semiconductor memory device, and shows a cross-section taken along the line BB of FIG. 42. FIG. 45 is a cross-sectional view showing the configuration of the same nonvolatile semiconductor memory device, and shows an enlarged view of the portion shown by C in FIG. 43. FIG. 46 is a cross-sectional view showing the configuration of the same nonvolatile semiconductor memory device, and shows an enlarged view of the portion shown by D in FIG. 43. Note that in the description below, portions similar to those of the first embodiment are assigned with identical reference symbols to those assigned in the first embodiment, and descriptions thereof will be omitted.

As shown in FIGS. 42 to 44, the nonvolatile semiconductor memory device according to the present embodiment is configured substantially similarly to the nonvolatile semiconductor memory device according to the first embodiment, but has a configuration of a buckling suppressing layer 330 which is different. That is, the buckling suppressing layer 330 according to the present embodiment has part of its film configuration identical to that of the memory columnar body 105.

That is, as shown in FIG. 45, the memory columnar body 105 according to the present embodiment comprises the charge accumulation layer 124, the tunnel insulating layer 123, the semiconductor layer 122, and the core insulating layer 121 described with reference to FIG. 4. Moreover, as shown in FIG. 46, the buckling suppressing layer 330 according to the present embodiment comprises a charge accumulation layer 324, an insulating layer 323, a semiconductor layer 322, and an insulating layer 321 stacked on a sidewall of the through hole H1. That is, the charge accumulation layer 324 and the insulating layer 323 are provided between the semiconductor layer 322 and the conductive layer 102. The charge accumulation layer 324 is configured from an identical material to the charge accumulation layer 124, and has an identical film thickness W1 to the charge accumulation layer 124. The insulating layer 323 is configured from an identical material to the tunnel insulating layer 123, and has an identical film thickness W2 to the tunnel insulating layer 123. The semiconductor layer 322 is configured from an identical material to the semiconductor layer 122, and has an identical film thickness W3 to the semiconductor layer 122. The insulating layer 321 is configured from an identical material to the core insulating layer 121. Note that as shown in FIGS. 45 and 46, the block insulating layer 125 is provided between the memory columnar body 105 and the conductive layer 102 and between the buckling suppressing layer 330 and the conductive layer 102, but these block insulating layers 125 are configured from identical materials to each other, and have identical film thicknesses w4 to each other.

The nonvolatile semiconductor memory device according to the present embodiment displays similar advantages to the nonvolatile semiconductor memory device according to the first embodiment. Moreover, the nonvolatile semiconductor memory device according to the present embodiment can be manufactured by fewer manufacturing steps compared to the nonvolatile semiconductor memory device according to the first embodiment.

[Method of Manufacturing]

Figure 47:
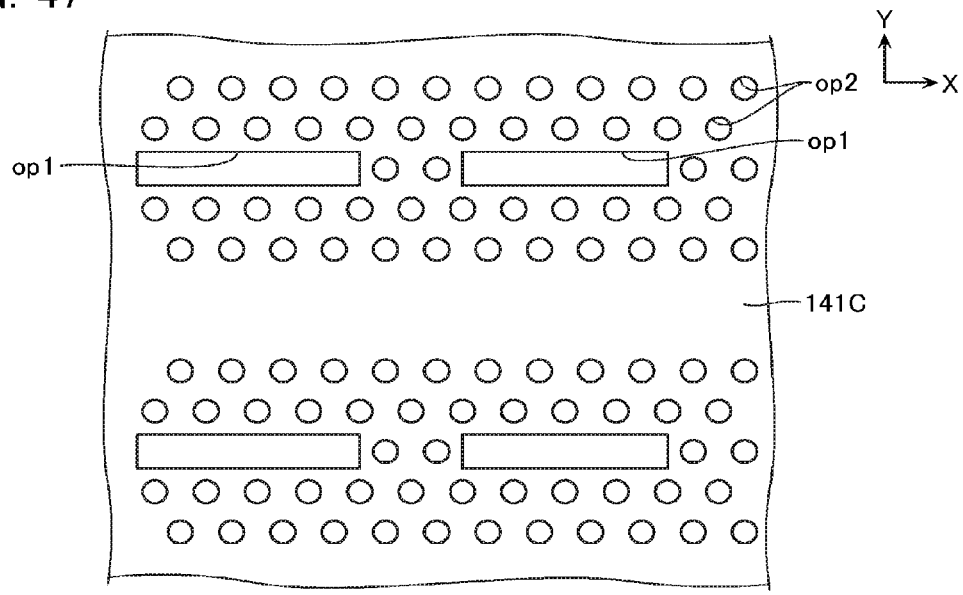
FIG. 47 is a plan view showing a manufacturing step of the same nonvolatile semiconductor memory device.

Next, a method of manufacturing a nonvolatile semiconductor memory device according to the second embodiment will be described with reference to FIGS. 47 to 52. FIGS. 47 and 50 are plan views for explaining the method of manufacturing according to the second embodiment. Moreover, FIGS. 48, 49, 51, and 52 are cross-sectional views for explaining the same method of manufacturing, and respectively correspond to the above-mentioned plan views.

In the method of manufacturing according to the present embodiment also, similarly to in the first embodiment, the plurality of sacrifice layers 141A and inter-layer insulating layers 103A are stacked alternately on the substrate 101, as shown in FIGS. 10 and 11.

Figure 48:
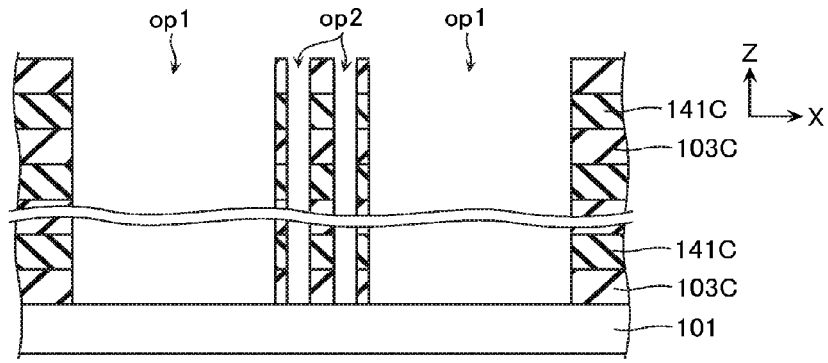
FIG. 48 is a cross-sectional view showing a manufacturing step of the same nonvolatile semiconductor memory device.
Figure 49:
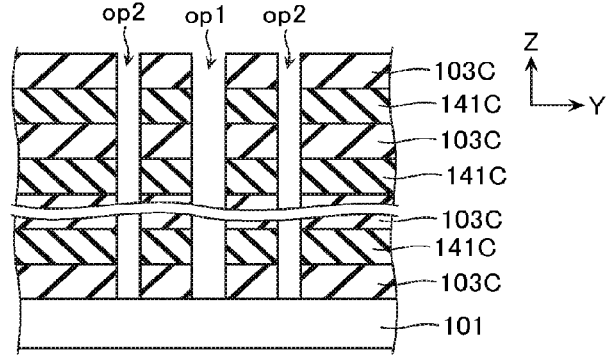
FIG. 49 is a cross-sectional view showing a manufacturing step of the same nonvolatile semiconductor memory device.
Figure 50:
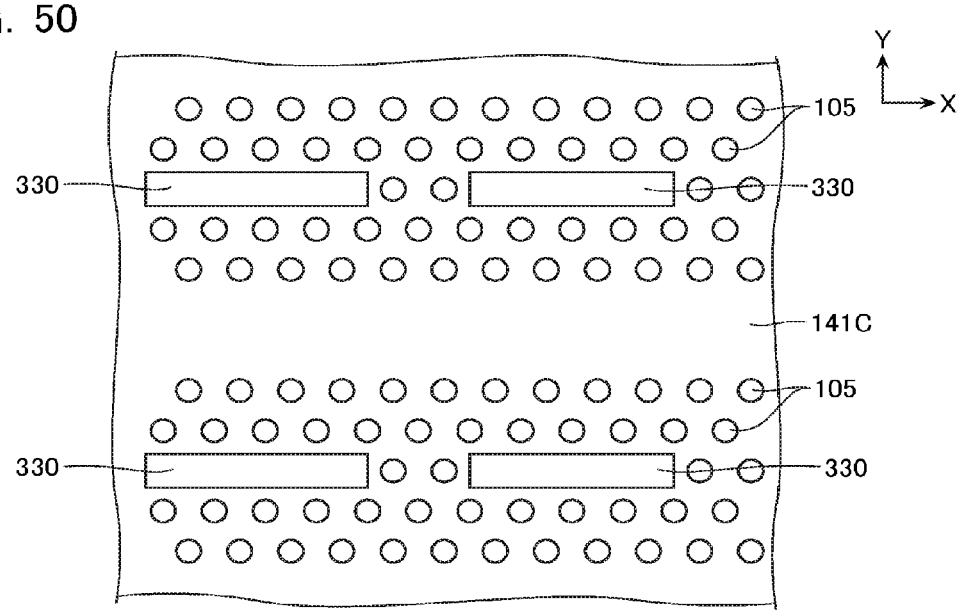
FIG. 50 is a plan view showing a manufacturing step of the same nonvolatile semiconductor memory device.

Next, as shown in FIGS. 47 to 49, the opening op1 and opening op2 penetrating the inter-layer insulating layer 103A and sacrifice layer 141A are formed, and the inter-layer insulating layer 103C and sacrifice layer 141C are formed. Note that the opening op1 and opening op2 may be positioned by an identical mask, or may be positioned sequentially by different masks.

Figure 51:
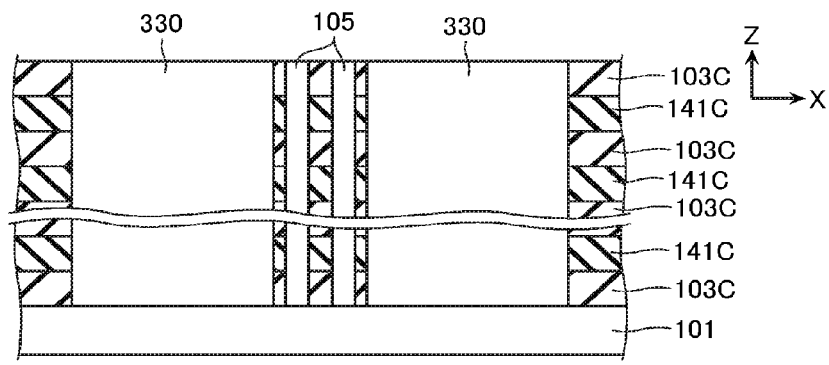
FIG. 51 is a cross-sectional view showing a manufacturing step of the same nonvolatile semiconductor memory device.
Figure 52:
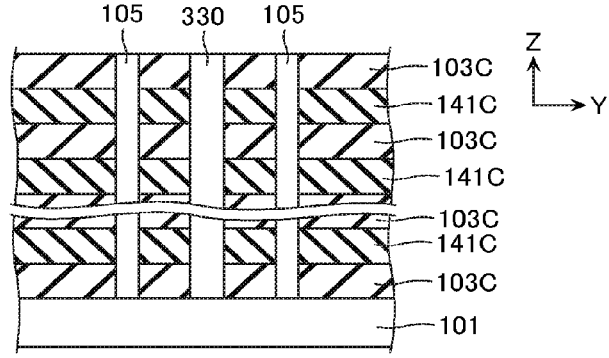
FIG. 52 is a cross-sectional view showing a manufacturing step of the same nonvolatile semiconductor memory device.

Next, as shown in FIGS. 50 to 52, the buckling suppressing layer 330 is formed inside the opening op1, and the memory columnar body 105 is formed inside the opening op2. For example, the charge accumulation layer 124, tunnel insulating layer 123, and semiconductor layer 122 described with reference to FIG. 4 are formed on inner walls of the opening op1 and opening op2, and the core insulating layer 121 is embedded therein.

Next, in the same method of manufacturing, steps similar to those described with reference to FIGS. 24 to 32 are performed.

Next, as shown in FIGS. 42 to 44, the portion covering the upper surface and sidewall of the inter-layer insulating layer 103, of the conductive layer 102A is removed, and the plurality of conductive layers 102 divided in the Z direction are formed. Next, the unillustrated insulating layer and the conductive layer 108 are formed in the opening op3. Furthermore, the bit line contact BC is formed on the memory columnar body 105, and the source line contact SC is formed on the conductive layer 108, and the bit line BL, source line SL, and so on, are formed. As a result, the nonvolatile semiconductor memory device according to the present embodiment is manufactured.

[Third Embodiment]

Figure 53:
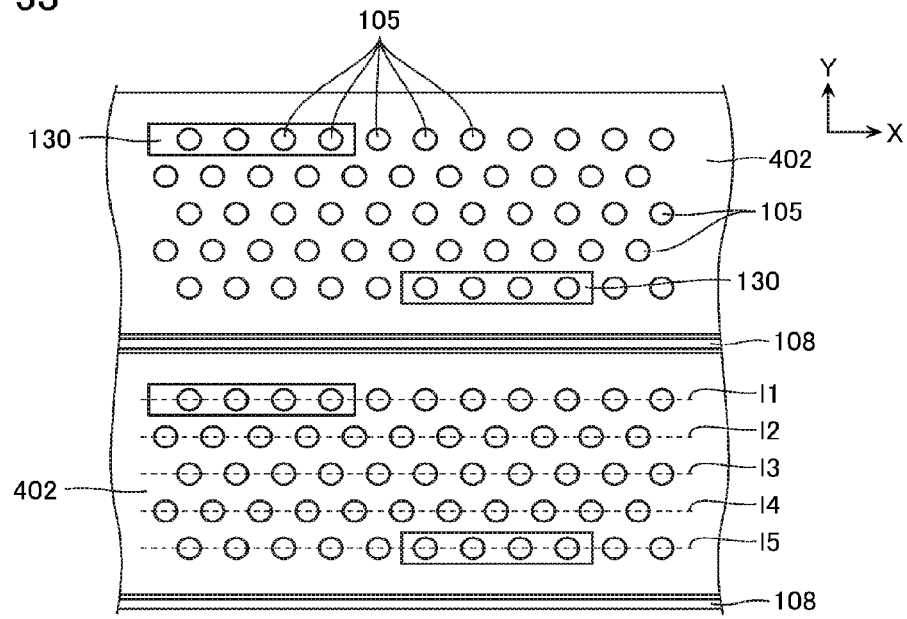
FIG. 53 is a plan view showing a configuration of part of a nonvolatile semiconductor memory device according to a third embodiment.
Figure 54:
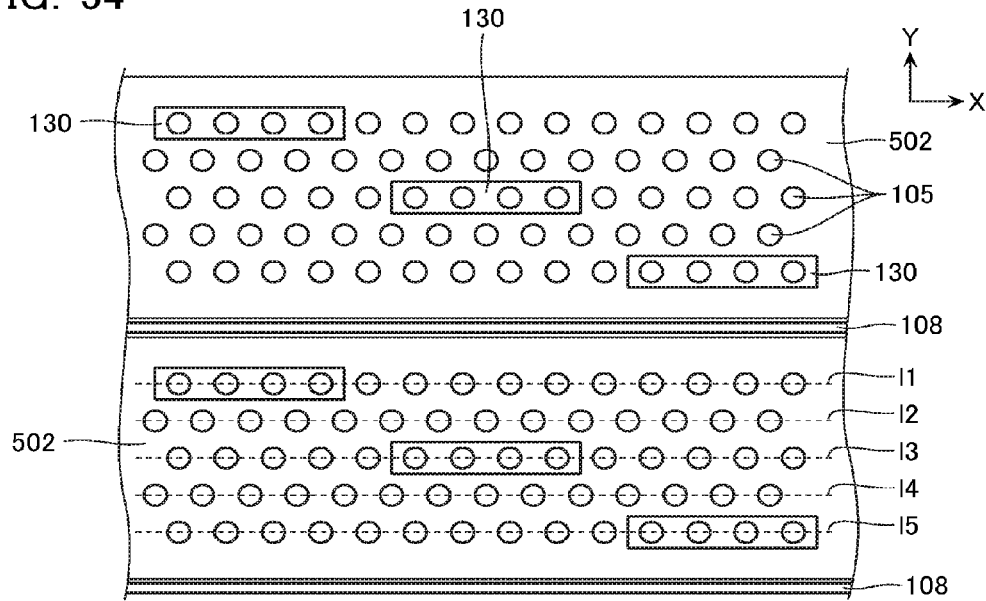
FIG. 54 is a plan view showing a configuration of part of a modified example of the nonvolatile semiconductor memory device according to the same embodiment.

Next, a configuration of a nonvolatile semiconductor memory device according to a third embodiment will be described with reference to FIGS. 53 and 54. FIGS. 53 and 54 are plan views respectively showing configurations of the same nonvolatile semiconductor memory device and a modified example thereof. Note that in the description below, portions similar to those of the first embodiment are assigned with identical reference symbols to those assigned in the first embodiment, and descriptions thereof will be omitted.

As described with reference to FIG. 5, in the conductive layer 102 according to the first embodiment, the through hole H1 and buckling suppressing layer 130 were provided in plurality along the imaginary line 13, but were not provided on the imaginary lines 11, 12, 14, and 15.

However, as shown in FIG. 53 or 54, the through hole H1 and buckling suppressing layer 130 may be provided separately on the other imaginary lines 11, 12, 14, and 15, or may be provided on the plurality of imaginary lines 11 to 15. This makes it possible to support the inter-layer insulating layer 103 by two or more buckling suppressing layers 130 having different positions in the Y direction and improve also rigidity to stress in the Y direction as well as to stress in the X direction.

Moreover, as shown in, for example, FIG. 53 or 54, when the buckling suppressing layers 130 are provided at places other than a central position in the Y direction of the conductive layer 102, positions in the Y direction of these buckling suppressing layers 130 may be provided so as to be equidistant from a central line (imaginary line 13) of the conductive layer 102.

[Fourth Embodiment]

Figure 55:
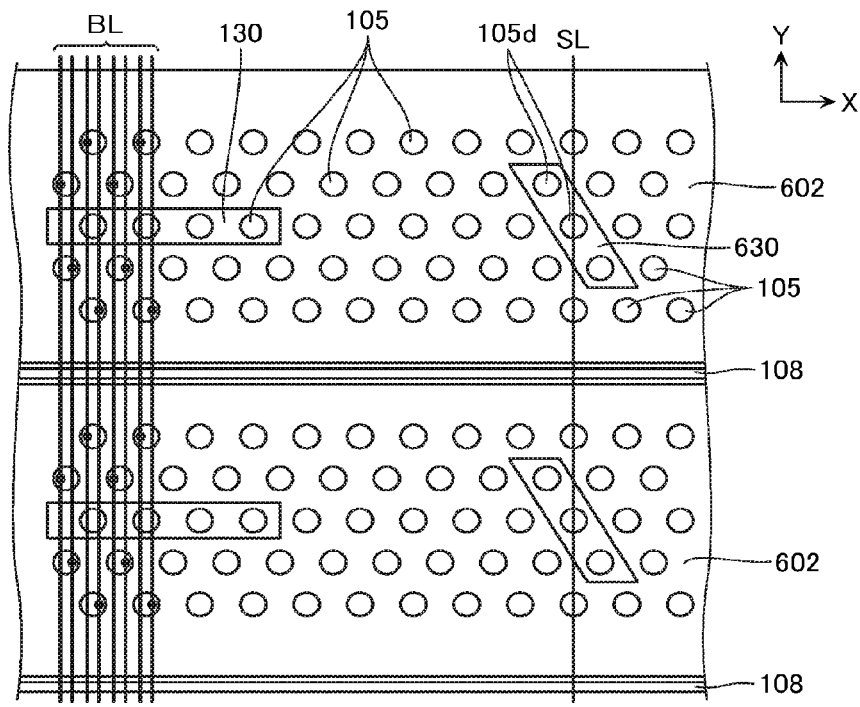
FIG. 55 is a plan view showing a configuration of part of a nonvolatile semiconductor memory device according to a fourth embodiment.

Next, a configuration of a nonvolatile semiconductor memory device according to a fourth embodiment will be described with reference to FIG. 55. FIG. 55 is a plan view showing the configuration of the same nonvolatile semiconductor memory device. Note that in the description below, portions similar to those of the first embodiment are assigned with identical reference symbols to those assigned in the first embodiment, and descriptions thereof will be omitted.

As shown in FIG. 5, in the conductive layer 102 according to the first embodiment, the buckling suppressing layer 130 had the X direction as its longitudinal direction, in the XY plane. However, as shown in FIG. 55, a buckling suppressing layer 630 may have as its longitudinal direction a certain direction intersecting the X direction, in the XY plane. This makes it possible to improve rigidity to stress in the longitudinal direction of the buckling suppressing layer 630. Moreover, as shown in FIG. 55, it is also possible for the buckling suppressing layer 130 whose longitudinal direction is the X direction and the buckling suppressing layer 630 whose longitudinal direction is a direction intersecting the X direction, to be used in combination. This makes it possible to improve rigidity to stress in the X direction and stress in the longitudinal direction of the buckling suppressing layer 630.

Moreover, the memory cell array 1 sometimes includes a memory columnar body 105 not used as the memory string MS. Hereafter, such a memory columnar body 105 will be called a "dummy columnar body 105d". For example, a memory columnar body 105 not connected to a bit line BL is a dummy columnar body 105d. For example, in the example shown in FIG. 55, the dummy columnar body 105d is provided directly below the source line SL (conductive layer 107 of FIG. 3). Now, the buckling suppressing layer 130 or buckling suppressing layer 630 may be formed so as to include the dummy columnar body 105d. This makes it possible to suppress a reduction in bit number per area. In particular, a plurality of the dummy columnar bodies 105d are provided along the Y direction directly below and close to the source line SL (conductive layer 107 of FIG. 3). Therefore, forming the buckling suppressing layer 630 so as to include such a plurality of dummy columnar bodies makes it possible to improve rigidity to stress in other than the X direction while suppressing a reduction in bit number per area.

[Fifth Embodiment]

Figure 56:
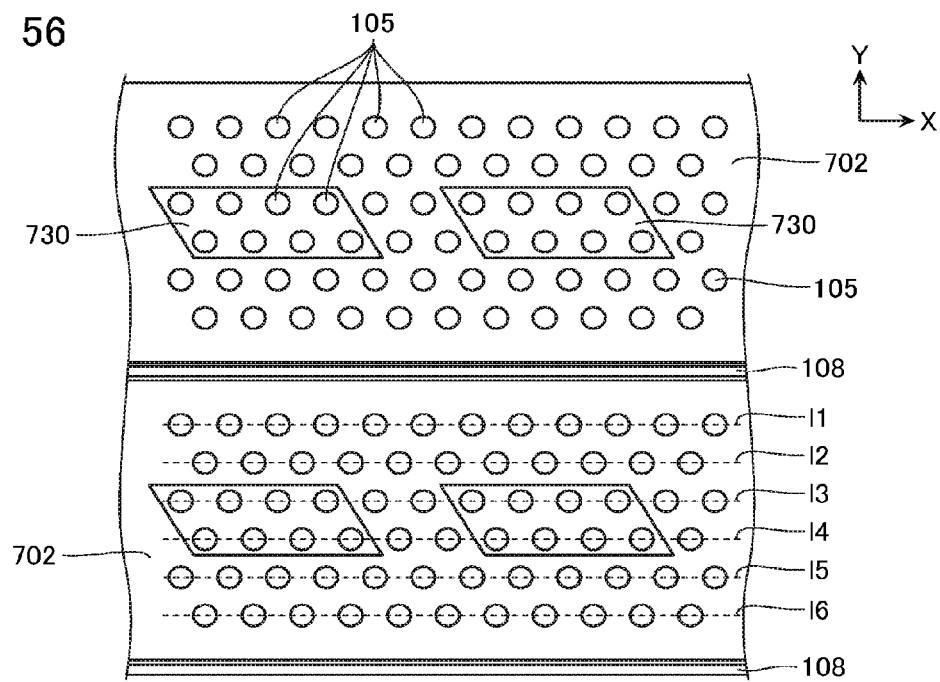
FIG. 56 is a plan view showing a configuration of part of a nonvolatile semiconductor memory device according to a fifth embodiment.

Next, a configuration of a nonvolatile semiconductor memory device according to a fifth embodiment will be described with reference to FIG. 56. FIG. 56 is a plan view showing the configuration of the same nonvolatile semiconductor memory device. Note that in the description below, portions similar to those of the first embodiment are assigned with identical reference symbols to those assigned in the first embodiment, and descriptions thereof will be omitted.

As described with reference to FIG. 5, in the first embodiment, the buckling suppressing layer 130 was formed along one imaginary line 13. However, as shown in FIG. 56, a buckling suppressing layer 730 may be formed straddling over a plurality of the imaginary lines (in the example shown in FIG. 56, the two imaginary lines 13 and 14). In this case, as shown in FIG. 56, the buckling suppressing layer 730 is adjacent in the X direction to the memory columnar bodies positioned on these imaginary lines. Moreover, in the example shown in FIG. 56, the memory columnar bodies positioned on, for example, the imaginary lines 11, 12, 15, and 16 may be operated as the memory string MS.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a stacked body of a plurality of conductive layers, the plurality of conductive layers being stacked above a substrate;
   a semiconductor layer having one end connected to the substrate, the semiconductor layer facing the plurality of conductive layers in the stacked body;
   a charge accumulation layer positioned between the conductive layer in the stocked body and the semiconductor layer; and
   a buckling suppressing layer surrounded by the stacked body in a plane parallel to the substrate,
   a width in a first direction parallel to the substrate, of the buckling suppressing layer being larger than a width in the first direction of the semiconductor layer.

2. The semiconductor memory device according to claim 1, wherein
   the width in the first direction of the buckling suppressing is larger than a width in a second direction parallel to the substrate and intersecting the first direction, of the buckling suppressing layer.

3. The semiconductor memory device according to claim 2, wherein
   the conductive layer in the stacked body has the first direction as its longitudinal direction.

4. The semiconductor memory device according to claim 2, wherein
   the conductive layer in the stacked body has as its longitudinal direction a direction different from the first direction.

5. The semiconductor memory device according to claim 1, comprising a plurality of the semiconductor layers,
   wherein the width in the first direction of the buckling suppressing layer is larger than a spacing between two of the semiconductor layers adjacent in the first direction.

6. The semiconductor memory device according to claim 1, wherein
   the conductive layer in the stacked body comprises:
   a low resistance region provided along a longitudinal direction of the conductive layer in the stacked body; and
   a control gate region provided along the low resistance region and provided with a facing portion that faces the semiconductor layer, and
   the conductive layer in the stacked body surrounds the buckling suppressing layer in the control gate region.

7. The semiconductor memory device according to claim 1, comprising a plurality of the semiconductor layers,
   wherein a certain semiconductor layer is adjacent to the buckling suppressing layer from the first direction.

8. The semiconductor memory device according to claim 1, wherein
   the conductive layer in the stacked body has the first direction as its longitudinal direction,
   the conductive layer in the stacked body comprises a plurality of facing portions each facing the semiconductor layer and provided along first and second imaginary lines aligned in parallel along the conductive layer in the stacked body and extending in the first direction; and the buckling suppressing layer is provided along the second imaginary line.

9. The semiconductor memory device according to claim 8, wherein a plurality of the buckling suppressing layers are provided along the second imaginary line.

10. The semiconductor memory device according to claim 8, wherein a plurality of the buckling suppressing layers are provided along the first imaginary line and the second imaginary line.

11. The semiconductor memory device according to claim 1, wherein the buckling suppressing layer includes:

a columnar body having as its longitudinal direction a direction perpendicular to the substrate, the columnar body including an identical material to the semiconductor layer; and an insulating layer surrounding the columnar body in a plane parallel to the substrate.

12. The semiconductor memory device according to claim 1, wherein the buckling suppressing layer includes a second semiconductor layer configured from an identical material to the semiconductor layer, and a second charge accumulation layer configured from an identical material to the charge accumulation layer is provided between the stacked body and the second semiconductor layer.

* * * * *